US 008654806B2

(12) United States Patent
Forrest et al.

(10) Patent No.: US 8,654,806 B2
(45) Date of Patent: Feb. 18, 2014

(54) ORGANIC SEMICONDUCTOR LASERS BY TRIPLET MANAGERS

(75) Inventors: Stephen R. Forrest, Ann Arbor, MI (US); Yifan Zhang, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/446,928

(22) Filed: Apr. 13, 2012

(65) Prior Publication Data
US 2013/0107904 A1   May 2, 2013

Related U.S. Application Data

(63) Continuation-in-part of application No. 13/283,284, filed on Oct. 27, 2011, now abandoned.

(51) Int. Cl.
*H01S 3/14* (2006.01)
*H01S 5/00* (2006.01)

(52) U.S. Cl.
USPC .......................................... 372/39; 372/45.01

(58) Field of Classification Search
USPC .................................. 372/39, 45.01
See application file for complete search history.

(56) References Cited

U.S. PATENT DOCUMENTS

| | | | |
|---|---|---|---|
| 6,569,544 B1 * | 5/2003 | Alain et al. | 428/690 |
| 7,264,889 B2 | 9/2007 | Kondakov et al. | |
| 7,279,704 B2 | 10/2007 | Walters et al. | |
| 2002/0028329 A1 | 3/2002 | Ise et al. | |
| 2002/0127427 A1 | 9/2002 | Young et al. | |
| 2003/0143427 A1 | 7/2003 | Matsuo et al. | |
| 2004/0066139 A1 | 4/2004 | Hamada et al. | |
| 2005/0095456 A1 * | 5/2005 | Takeda | 428/690 |
| 2007/0126347 A1 | 6/2007 | Jarikov et al. | |
| 2012/0001536 A1 * | 1/2012 | Zhang et al. | 313/504 |

OTHER PUBLICATIONS

Ruhstaller et al.,"Transient and steady-state behavior of space charges in multilayer organic light-emitting diodes", J. Appl. Phys. vol. 89(8): pp. 4575-4586, (2001).
Qi, et al., "Stacked white organic light emitting devices consisting of separate red, green, and blue elements." Appl. Phys. Lett. vol. 93(19): pp. 193306-1-193306-3 (2008).
Giebink, et al., "Temporal response of optically pumped organic semiconductor lasers and its implication for reaching threshold under electrical excitation", Phys. Rev. B. vol. 79: pp. 073302-1-073302-4, (2009).

(Continued)

*Primary Examiner* — Armando Rodriguez
(74) *Attorney, Agent, or Firm* — Morgan, Lewis & Bockius, LLP

(57) ABSTRACT

A first device is provided. The device includes an organic semiconductor laser. The organic semiconductor laser further includes an optical cavity and an organic layer disposed within the optical cavity. The organic layer includes: an organic host compound; an organic emitting compound capable of fluorescent emission; and an organic dopant compound. The organic dopant compound may also be referred to herein as a "triplet manager." The triplet energy of the organic dopant compound is lower than or equal to the triplet energy of the organic host compound. The triplet energy of the organic dopant compound is lower than or equal to the triplet energy of the organic emitting compound. The singlet energy of the organic emitting compound is lower than or equal to the singlet energy of the organic host compound.

28 Claims, 13 Drawing Sheets

(56) References Cited

OTHER PUBLICATIONS

Ma et al., "Time-resolved transient electroluminescence measurements of emission from DCM-doped Alq3 layers", Chemical Physics Letters, vol. 397, pp. 87-90 (2004).
Ruhstaller et al., "Simulating Electronic and Optical Processes in Multilayer Organic Light-Emitting Devices", IEEE Journal of Selected Topics in Quantum Electronics, vol. 9(3): pp. 723-731, (2003).
Gu et al., "High-external-quantum-efficiency organic light-emitting devices", Opt. Lett., vol. 22, Issue 6, 396-398 (1997).
Moller et al., "Improved light out-coupling in organic light emitting diodes employing ordered microlens arrays", J. Appl. Phys., vol. 91, p. 3324 (2002).
Tsutsui et al., "Doubling Coupling-Out Efficiency in Organic Light-Emitting Devices Using a Thin Silica Aerogel Layer", Advanced Materials, vol. 13, Issue 15, pp. 1149-1151 (2001).
Madigan et al., "Improvement of output coupling efficiency of organic light-emitting diodes by backside substrate modification", Appl. Phys. Lett., vol. 76, p. 1650 (2000).
Slootsky et al., "Full-wave simulation of enhanced outcoupling of organic light-emitting devices with an embedded low-index grid", Appl. Phys. Lett., vol. 94, pp. 163302-1-163302-3, (2009).
Hosokawa et al., "Transient behavior of organic thin film electroluminescence", Appl. Phys. Lett., vol. 60 (10), pp. 1220-1222, (1992).
Kozlov et al., "Optical Properties of molecular organic semiconductor thin films under intense electrical excitation", Appl. Phys. Lett., vol. 74 (8), pp. 1057-1059, (1999).
Das et al., "Transient electroluminescence under double voltage pulse: Charge accumulation in light-emitting devices based on alizarin violet", Appl. Phys. Lett., vol. 76 (13), pp. 1770-1772, (2000).
Hassine et al., "Transient response of a bilayer organic electroluminescent diode: Experimental and theoretical study of electroluminescence onset", Appl. Phys. Lett., vol. 78(8), pp. 1053-1055, (1992).
Young et al., "Current-induced fluorescence quenching in organic light-emitting diodes", Appl. Phys. Lett., vol. 80 (5), pp. 874-876, (2002).
Shi et al., "Anthracene derivatives for stable blue-emitting organic electroluminescence devices", Appl. Phys. Lett., vol. 80 (17), pp. 3201-3203, (2002).
Okumoto et al., "Green fluorescent organic light-emitting device with external quantum efficiency of nearly 10%," Appl. Phys. Lett., vol. 89, pp. 063504-1-063504-3, (2006).
Matsushima et al., "Suppression of exciton annihilation at high current densities in organic light-emitting diode resulting from energy-level alignments of carrier transport layers", Appl. Phys. Lett., vol. 92, pp. 063306-1-063306-3, (2008).
Luo et al., "Electron-Induced Quenching of Excitons in Luminescent Materials", Chem. Mater., vol. 19, p. 2288-2291 (2007).
Tang et al., "Electroluminescence of doped organic thin films", Appl. Phys 85(9), pp. 3610-3616, (1989).
Nikitenko et al., "The overshoot effect in transient electroluminescence from organic bilayer light emitting diodes: Experiment and theory", J. Appl. Phys., vol. 81(11), pp. 7515-7525, (1997).
Pinner et al., "Transient electroluminescence of polymer light emitting diodes using electrical pulses", J. Appl. Phys., vol. 86(9), pp. 5116-5130, (1999).
Adachi et al., "Nearly 100% internal phosphorescence efficiency in an organic light emitting device", J. Appl. Phys., vol. 90(10), pp. 5048-5051, (2001).
Goushi et al., "Triplet exciton confinement and unconfinement by adjacent hole-transport layers", J. Appl. Phys., vol. 95(12), pp. 7798-7802, (2004).
Gärtner et al., "The influence of annihilation processes on the threshold current density of organic laser diodes", J. Appl. Phys, vol. 101, pp. 023107-1-023107-9, (2007).
Kondakov et al., "Triplet annihilation exceeding spin statistical limit in highly efficient fluorescent organic light-emitting diodes", J. Appl. Phys., vol. 106, pp. 124510-1-124510-7, (2009).
Köhler et al., "Triplet states in organic semiconductors", Mat. Sci. & Eng. R, vol. 66, pp. 79-109, (2009).
Baldo et al., "Excitonic singlet-triplet ratio in a semiconducting organic thin film", Phys. Rev. B., vol. 60(20), pp. 14 422-14 428, (1999).
Baldo et al., "Prospects for electrically pumped organic laser", Phys. Rev. B., vol. 66, pp. 035321-1-035321-16, (2002).
Tanaka et al., "Observation of phosphorescence from tris(8-hydroxyquinoline) aluminum thin films using triplet energy transfer from iridium complexes", Phys. Rev. B, vol. 71, pp. 205207-1-205207-6, (2005).
Giebink et al., "Quantum efficiency roll-off at high brightness in fluorescent and phosphorescent organic light emitting diodes", Phys. Rev. B, vol. 77, pp. 235215-1-235215-9 (2008).
Fourny et al., "Singlet-Triplet Interactions in Crystalline Anthracene", Phys. Rev. Lett., vol. 21(15), pp. 1085-1088 (1968).
Müchl et al., "Transient electroluminescence measurements on organic heterolayer light emitting diodes", Synthetic Metals, vol. 111-112, pp. 91-94 (2000).
U.S. Appl. No. 61/396,862, filed Jun. 3, 2010.
U.S. Appl. No. 61/398,627, filed Jun. 29, 2010.
U.S. Appl. No. 13/283,284, filed Oct. 27, 2011.
U.S. Appl. No. 12/117,926, filed May 27, 2011.
Tessler et al., Lasing from conjugated-polymer microcavities. Nature 382, 695-697 (1996).
Bulovic et al. Transform-limited, narrow-linewidth lasing action in organic semiconductor microcavities. Science 279, 553-555, (1998).
Kozlov, V. G. et al. Structures for organic diode lasers and optical properties of organic semiconductors under intense optical and electrical excitations. Ieee Journal of Quantum, Electronics 36, 18-26 (2000).
Lehnhardt et al., Impact of triplet absorption and triplet-singlet annihilation on the dynamics of optically pumped organic solid-state lasers. Phys. Rev. B81, 165206 (2010).
Schafer, F. P. Dye Lasers. (Springer, 1990), p. 52-59.
Snavely, B. B. Flashlamp-excited organic dye lasers. Proceedings of the IEEE 57, 1374-1390, (1969).
Schols, S.et al., Triplet Excitation Scavenging in Films of Conjugated Polymers. ChemPhysChem 10, 1071-1076 (2009).
Bornemann et al.,. Continuous-wave solid-state dye laser. Opt. Lett. 31, 1669-1671 (2006).
Kozlov, V. G. et al. Study of lasing action based on Forster energy transfer in optically pumped organic semiconductor thin films. J. Appl. Phys. 84, 4096-4108 (1998).
Zhang et al., Singlet-triplet quenching in high intensity fluorescent organic light emitting diodes. Chem. Phys. Lett. 495, 161-165 (2010).
Lehnhardt et al., Room temperature lifetime of triplet excitons in fluorescent host/guest systems. Org. Electron. 12, 486-491 (2011).
Rijn, C. J. M. Laser interference as a lithographic nanopatterning tool. Journal of Microlithography, Microfabrication, and Microsystems 5, 011012 (2006).
Rabe, et al., Appl. Phys. Lett. 89 (8), 081115 (2006).
Lehnhardt, et al. Org. Electron. 12 (8), 1346-1351 (2011).
Kozlov et al., "Laser action in organic semiconductor waveguide and double-heterostructure devices", Nature 389, p. 362-364 (1997).
Samuel et al., Organic Semiconductor Lasers, Chem. Rev. 107, 1272-1295(2007).
Carroll, J., Whiteaway, J. & Plumb, D. Distributed feedback semiconductor lasers. (The Institution of Electrical Engineers,) 1998, pp. 128-129.
Turro, N. J. Modern Molecular Photochemistry. (University Science Books) 1991.

* cited by examiner

ORGANIC SEMICONDUCTOR LASERS BY TRIPLET MANAGERS

CROSS-REFERENCES TO RELATED APPLICATIONS

This application claims priority to, is a continuation-in-part of, and incorporates by reference in its entirety U.S. Ser. No. 13/283,284 filed on Oct. 27, 2011.

This application is related to U.S. application Ser. No. 13/117,926, filed May 27, 2011, which claims priority to U.S. 61/396,862, filed Jun. 3, 2010, and U.S. 61/398,627, filed Jun. 29, 2010. These related applications are incorporated by reference in their entireties.

STATEMENT AS TO RIGHTS TO INVENTIONS MADE UNDER FEDERALLY SPONSORED RESEARCH OR DEVELOPMENT

This invention was made with government support under FA9550-10-1-0339 awarded by the AFOSR (AirForce Office of Scientific Research). The government has certain rights in the invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to lasers using organic materials.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photo detectors.

Various ways to deposit the organic materials used to fabricate organic devices are known, such as vacuum thermal evaporation, solution processing, organic vapor phase deposition, and organic vapor jet printing.

SUMMARY OF THE INVENTION

A first device is provided. The device includes an organic semiconductor laser. The organic semiconductor laser further includes an optical cavity and an organic layer disposed within the optical cavity. The organic layer includes: an organic host compound; an organic emitting compound capable of fluorescent emission; and an organic dopant compound. The organic dopant compound may also be referred to herein as a "triplet manager." The triplet energy of the organic dopant compound is lower than or equal to the triplet energy of the organic host compound. The triplet energy of the organic dopant compound is lower or equal to than the triplet energy of the organic emitting compound. The singlet energy of the organic emitting compound is lower than or equal to the singlet energy of the organic host compound.

In some embodiments, in the first device as described above, the singlet energy of the organic emitting compound is lower than the singlet energy of the organic host compound.

Preferably, the singlet energy of the organic emitting compound is lower than the singlet energy of the organic dopant compound.

Preferably, the organic dopant compound does not strongly absorb the fluorescent emission of the organic emitting compound.

In one embodiment, the first device further includes an optical pump optically coupled to the organic layer.

In one embodiment, the organic semiconductor laser further includes an anode and a cathode. The organic layer is disposed between the anode and the cathode. A hole transport layer is disposed between the organic layer and the anode. An electron transport layer is disposed between the organic layer and the cathode. The organic dopant compound is present only in the emissive layer.

Preferably, the triplet decay time of the dopant compound is shorter than the triplet decay time of the emitting compound.

Preferably, the concentration of the dopant compound is 10 wt %-90 wt %, and the concentration of the emitting compound is 0.5 wt %-5 wt %.

Preferably, the organic emitting compound is capable of fluorescent emission at room temperature.

Preferably, the dopant compound is selected from the group consisting of: anthracene, tetracene, rubrene, and perylene and their derivatives. More preferably, the dopant compound is selected from anthracene and its derivatives are particularly preferred. More preferably, the dopant compound is ADN.

In some embodiments, the dopant compound is a phosphor. In some embodiments, the dopant compound is a fluorophore.

In some embodiments, in the first device as described above, the organic semiconductor laser may further comprise a feedback structure. In some embodiments, the feedback structure may comprise anyone of, or some combination of a planar waveguide structure; a distributed feedback structure; a Bragg reflector feedback structure; or a vertical cavity structure surface emitting structure (VCSEL).

In some embodiments, in the first device as described above, the organic semiconductor laser may further comprise a substrate. The anode of the device may be disposed over the substrate and at least one mirror is disposed between the substrate and the anode.

In some embodiments, in the first device as described above, the organic semiconductor laser may further comprise a hole injection layer disposed between the anode and the hole transport layer, and an electron injection layer disposed between the cathode and the electron transport layer.

The first device may be a consumer product.

A method is provided. An organic semiconductor laser is provided. The organic semiconductor laser further includes an optical cavity and an organic layer disposed within the optical cavity. The organic layer includes: an organic host compound; an organic emitting compound capable of fluorescent emission; and an organic dopant compound. The organic dopant compound may also be referred to herein as a "triplet manager." The triplet energy of the organic dopant compound is lower than or equal to the triplet energy of the organic host compound. The triplet energy of the organic dopant compound is lower or equal to than the triplet energy of the organic emitting compound. The singlet energy of the organic emitting compound is lower than or equal to the singlet energy of the organic host compound. The organic semiconductor laser is pumped to achieve lasing.

In some embodiments, in the method as described above, the singlet energy of the organic emitting compound is lower than the singlet energy of the organic host compound.

In one embodiment, the pumping is optical pumping.

In one embodiment, the pumping is electrical pumping.

When the organic semiconductor laser is pumped, lasing is achieved for at least 1 microsecond.

In some embodiments, the organic semiconductor laser is pumped at a power that exceeds the pulse threshold.

In some embodiments, the organic semiconductor laser is pumped at a power that exceeds the continuous wave threshold.

In some embodiment, the organic semiconductor laser is pumped at a power that exceeds the continuous wave threshold for at least 1 microsecond, and more preferably for at least 100 microseconds.

Figure 3:
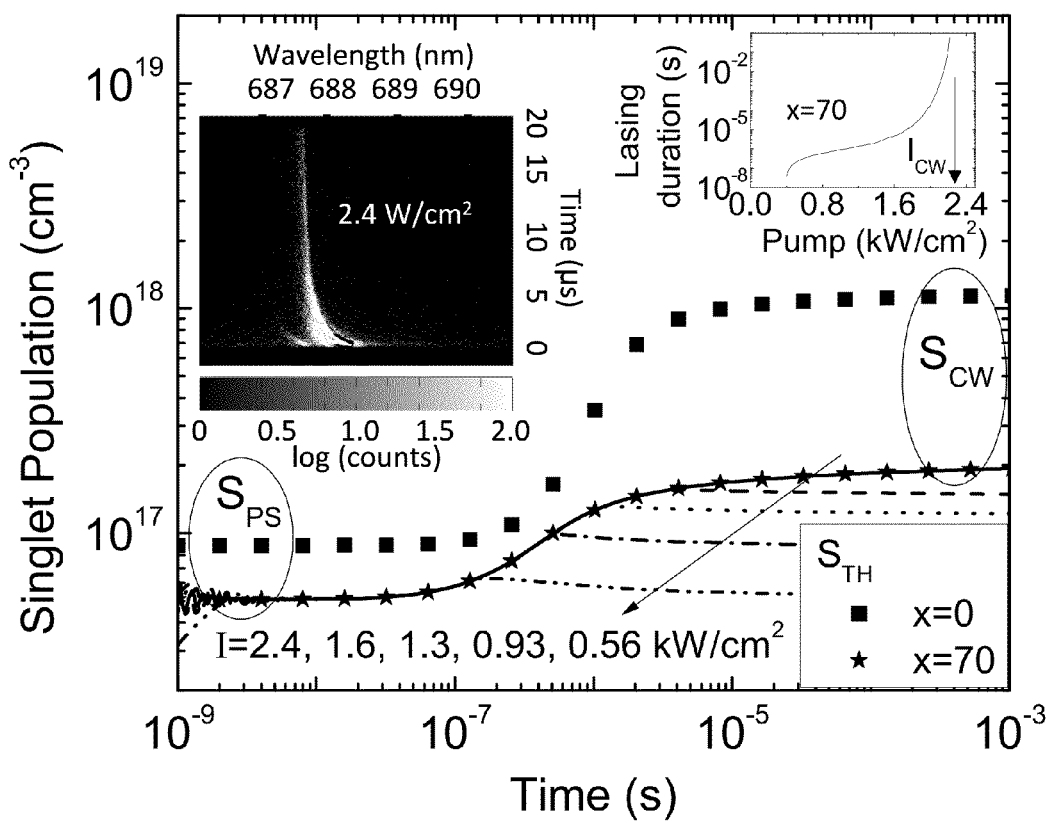
FIG. 3 shows simulated threshold singlet population, $S_{TH}$ (t) with (x=70, stars) and without (squares) a triplet manager, and S(t) (lines) for the x=70 OSL. Lasing occurs when $S \geq S_{TH}$. The dashed lines correspond to lasers that have exceeded their pulsed threshold singlet population ($S_{PS}$), but not their CW threshold ($S_{CW}$). Left Inset: Streak camera image of laser emission for a triplet-managed OSL (x=70) measured at 2.4 kW/cm$^2$ pump intensity, 18 µs pulse width. Right Inset: Simulated lasing duration evolution with increasing pump power for x=70 triplet managed OSL.

The lasing wavelength is slightly different from the inset of FIG. 3 because these two lasers are not fabricated at the same time and their gain medium thicknesses or grating periods can be slightly different.

Figure 8A:
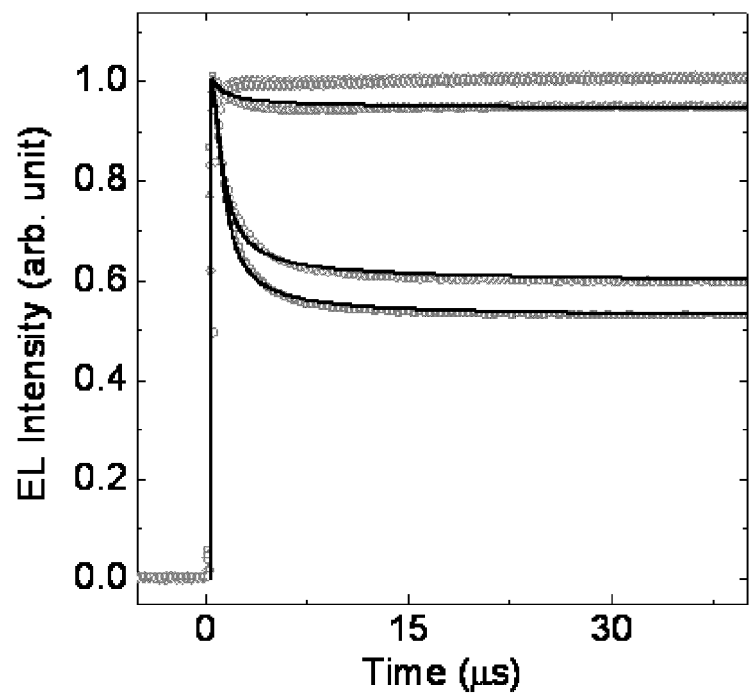
Figure 8B:
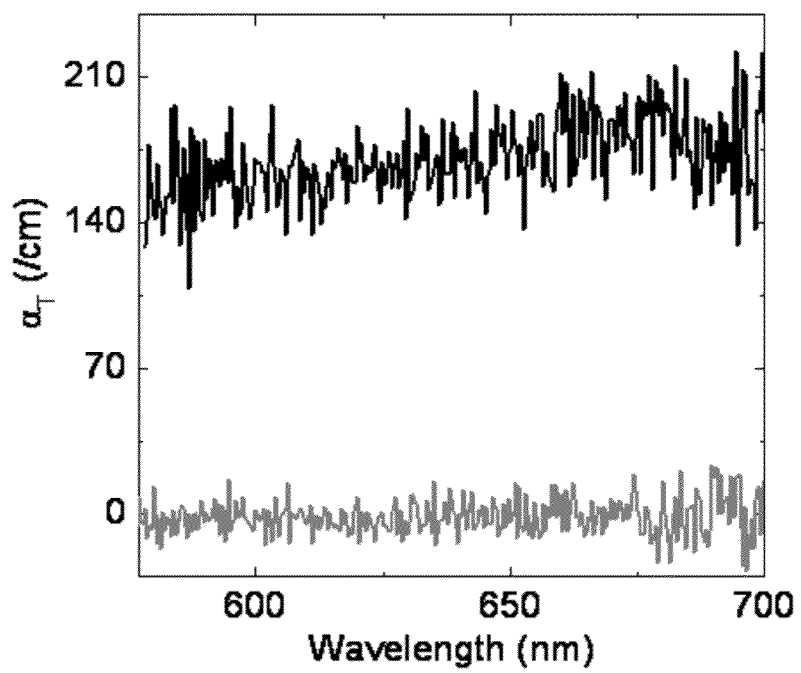

FIG. 8(a) illustrates EL transients of OLEDs at various concentrations (0, 10%, 30%, 50%, 70% from bottom to top) of ADN as a triplet manager pumped at 2 A/cm$^2$ using rectangular current pulses. Lines are fits to the model. FIG. 8(b) shows a Triplet absorption coefficient, $\alpha_r$, for 2% DCM2 doped ALq$_3$ and ADN films versus wavelength.

Figure 9:
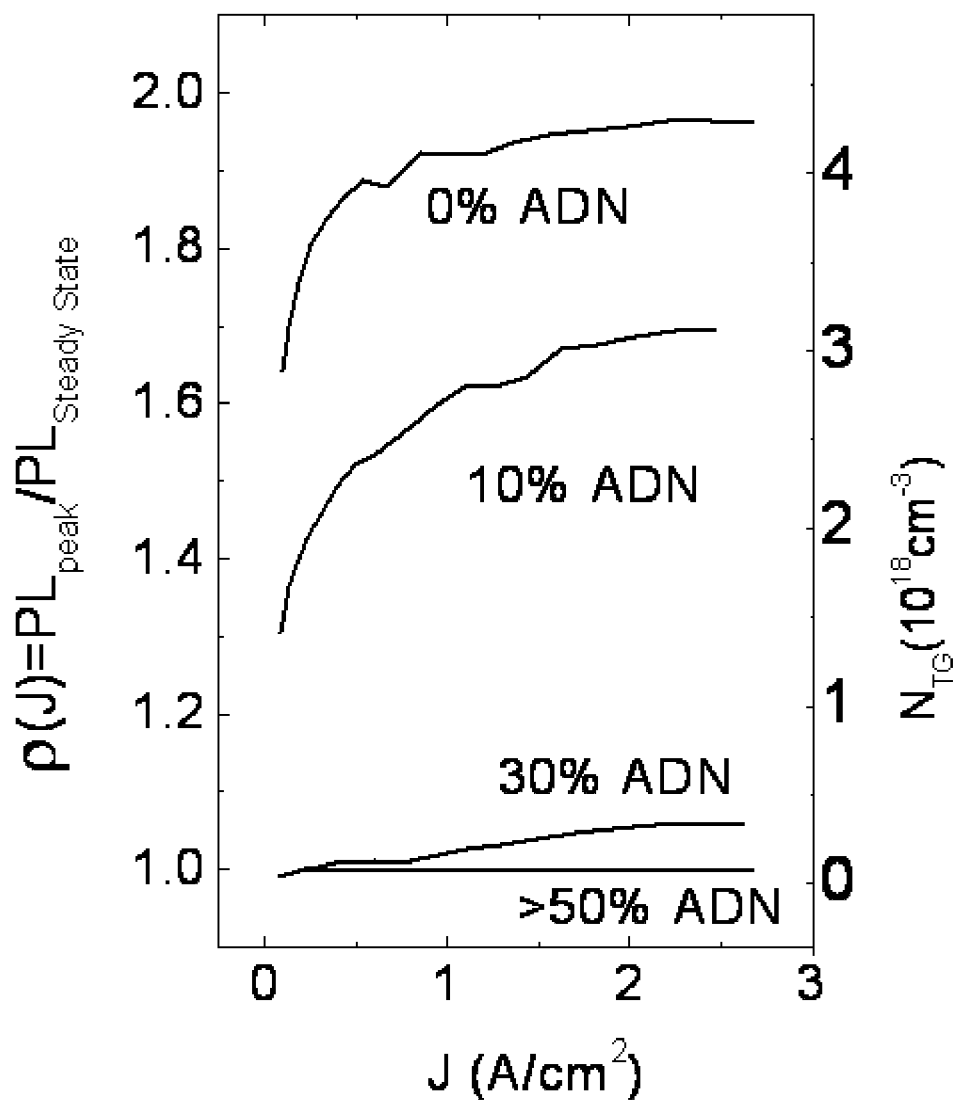

FIG. 9 illustrates intensity peak-to-peak-steady-state ratio (ρ on left axis) as a function of current density for OLEDs with different ADN concentrations. The corresponding guest triplet populations ($N_{GT}$ on right axis) are calculated below.

Figure 10A:
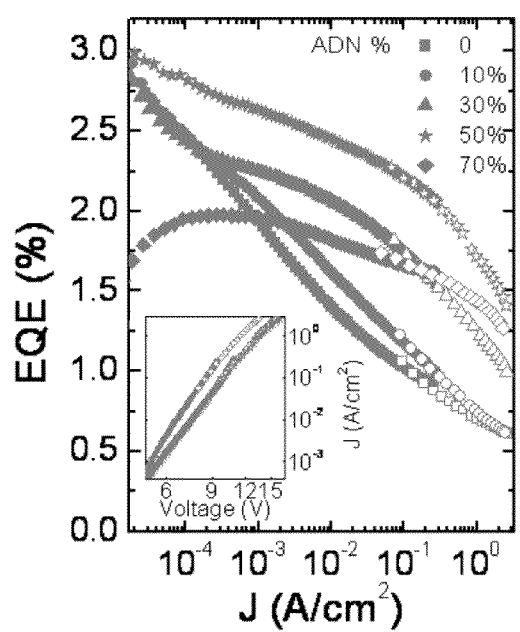
Figure 10B:
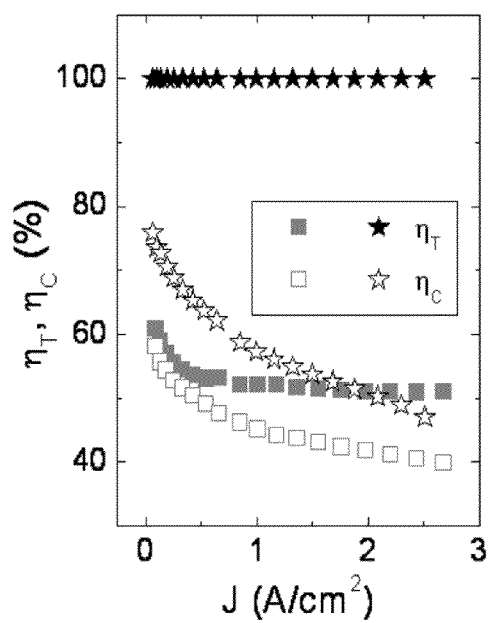

FIG. 10(a) illustrates the EQE or triplet-managed OLEDs with different ADN concentrations (x). The filled symbols are from steady-state measurements, and open symbols are from transient measurements. The inset shows current density vs. voltage (J-V) characteristics for x≤50% (almost identical) and x=70% OLEDs. FIG. 10(b) illustrates triplet ($\eta_r$) and charge ($\eta_c$) induced external quantum efficiency (EQE) roll-off for x=0 and 50% OLEDs.

Figure 11A:
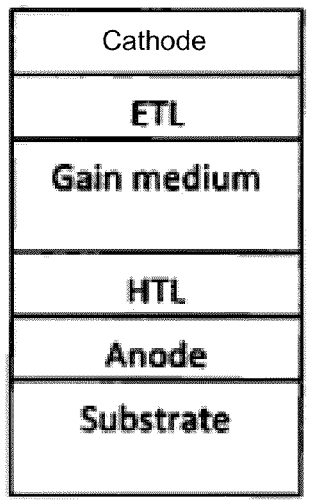
Figure 11B:
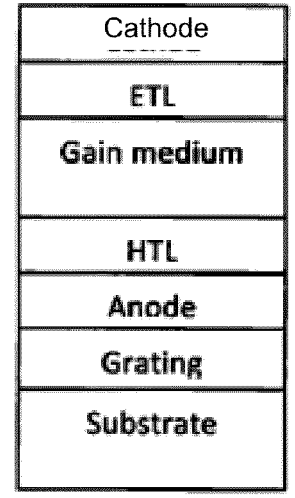
Figure 11C:
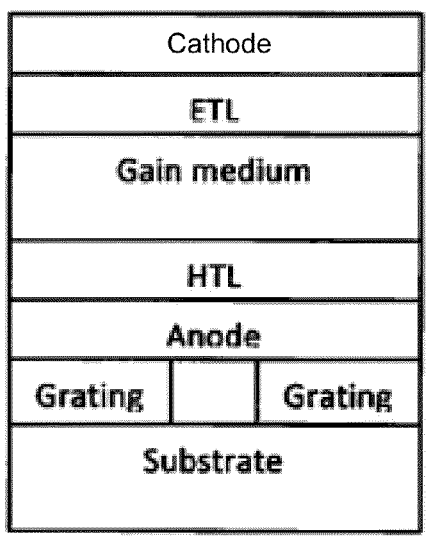

FIGS. 11(a)-(c) depict various examples of feedback structures for laser devices according to aspects of the invention.

Figure 12:
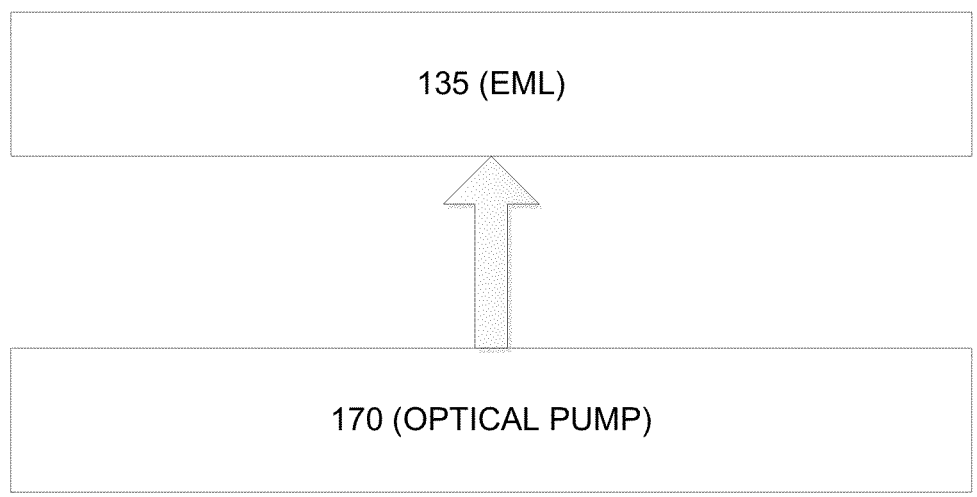
Figure 13:
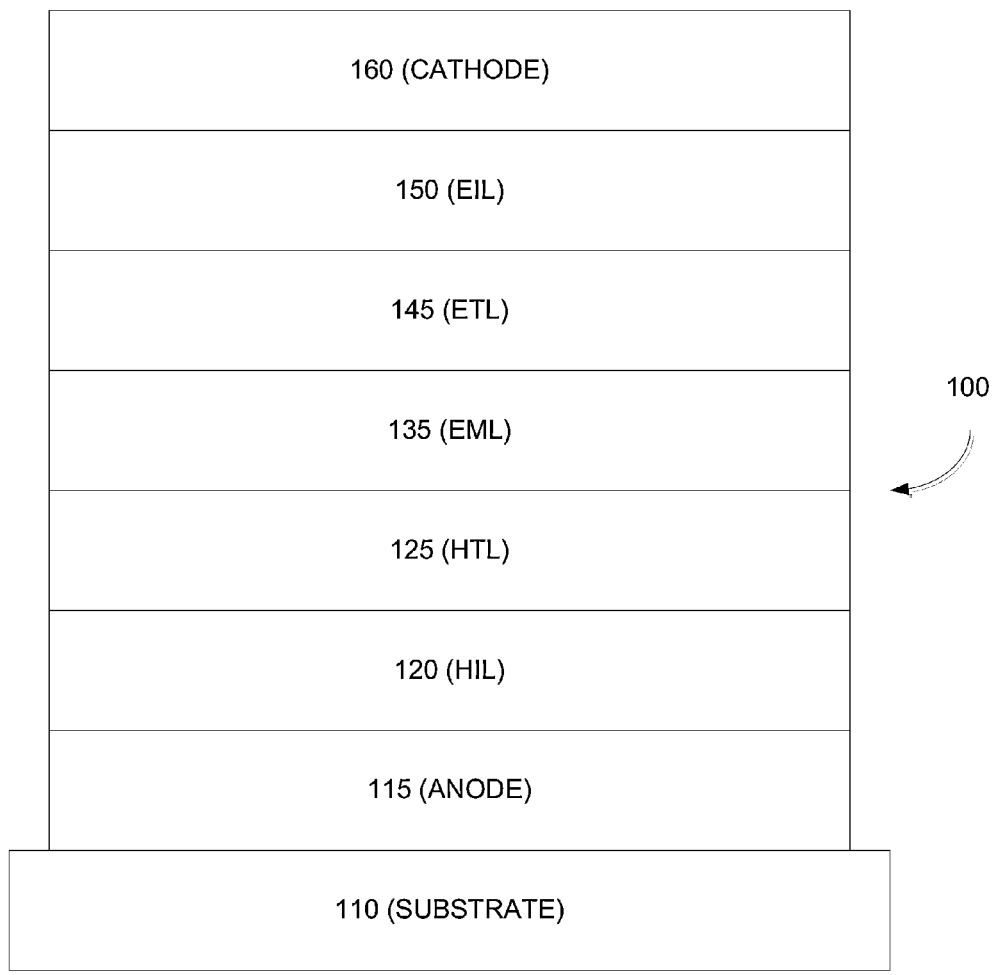

FIG. 12 is a schematic illustration of an exemplary optical pump optically coupled to an emissive layer according to aspects of the invention FIG. 13 depicts an exemplary light emitting device according to aspects of the invention.

DETAILED DESCRIPTION

A model has been developed for organic lasers that predicts two threshold pump intensities in optically pumped organic semiconductor lasers (OSLs); one for pulsed lasing, $I_{PS}$, and another for continuous-wave (CW) lasing, $I_{CW}$. The theory predicts a decrease in $I_{CW}$ from 32 kW/cm$^2$, or well above the damage threshold, to 2.2 kW/cm$^2$, for a laser employing 4-(dicyanomethylene)-2-methyl-6-julolidyl-9-enyl-4H-pyran (DCM2) doped tris(8-hydroxyquinoline)aluminum (Alq$_3$) if the triplets can be effectively removed from the emissive guest. Based on this analysis, it has been demonstrated that the lasing duration can be extended to nearly 100 µs, ultimately limited by degradation of the lasing medium when a "triplet manager" molecule, 9,10-di(naphtha-2-yl) anthracene (ADN), is blended into the gain region of a distributed feedback OSL. The triplet manager facilitates radiative singlet transfer while suppressing non-radiative triplet transfer to the emitter molecule, thus reducing the triplet-induced losses. Our theory conclusively shows that these lasers have entered the CW lasing regime.

Optically pumped organic semiconductor lasers (OSLs) with low thresholds and wide spectral tuning ranges have attracted interest since their demonstration 15 years ago. However, a significant obstacle to the application of OSLs has been their limitation to only pulsed operation with a maximum duration of several tens of nanoseconds. This limitation is imposed by the build-up of triplet (T) excitons in the gain region that are generated from intersystem crossing (ISC) of radiative singlets (S). Since the relaxation from T to the ground state is quantum mechanically forbidden, the lifetime of T exciton is large (~ms) compared to S (~ns), allowing the T population can accumulate over time. The high T population, together with overlapping S emission and T absorption, results in singlet and photon losses that ultimately shut down lasing, thereby preventing continuous-wave (CW) operation.

While triplet losses in liquid dye lasers can be mitigated by using quencher molecules with triplet energies lower than that of the dye, no CW operation has been realized without dye circulation. For OSLs, gain medium circulation is not possible; however, several efforts have been made to mitigate, although not eliminate triplet losses to the extent that CW operation can be achieved. Bornemann, et al., Opt. Lett. 31 (11), 1669-1671 (2006), have used a rapidly rotating substrate to demonstrate a CW solid state dye laser, but the output was unstable. Schols, et al., ChemPhysChem 10 (7), 1071-1076 (2009), have shown that "scavengers" can be used to de-excite triplets, but no lasing improvement was demonstrated. Rabe, et al., Appl. Phys. Lett. 89 (8), 081115 (2006), and Leahnhardt, et al. Org. Electron. 12 (8), 1346-1351 (2011), demonstrated a polymer OSL pumped by very low duty cycle (<0.1%) pulses to extend the total duration to 400 μs, although this is not true CW operation.

Figure 1:
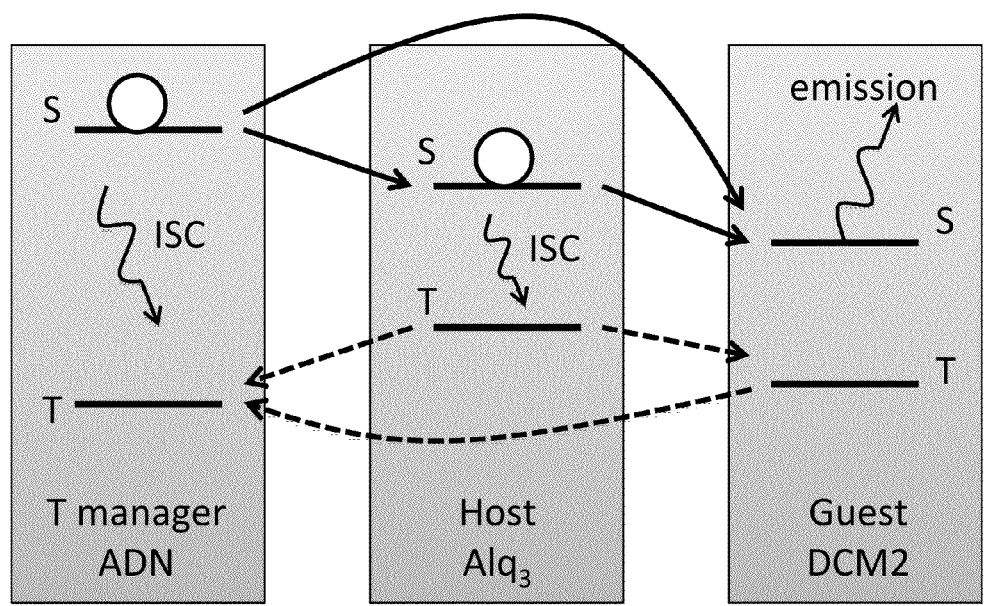
FIG. 1 shows separate channels for singlet (S) and triplet (T) formation and transfer in triplet managed lasers. Singlets are generated (circles) on both Alq$_3$ and ADN, and Förster transferred (solid arrows) to DCM2. Triplets are generated by intersystem crossing (ISC) or singlet fission and collected by ADN through Dexter transfer (dashed arrows).

Here, we introduce a "triplet manager" into the gain region along with the guest emitter and host molecules. The manager reduces the emitter triplet population, thus extending the lasing duration. The inset of FIG. 1 shows the triplet management concept. The manager has lower triplet energy and higher singlet energy than the emitter. When either the host or manager molecules are excited, Förster transfer of S-states to the emitter is highly efficient. Furthermore, Dexter transfer of triplets lead to their trapping on the manager since it has lower triplet energy than both the guest and the host. The manager triplet absorption is shifted from the guest emission and thus the trapped triplets do not contribute to optical losses or singlet quenching.

The 200 nm thick OSL active region consists of the manager, 9,10-di(naphtha-2-yl)anthracene (ADN), co-deposited into the conventional guest-host gain medium consisting of 2 vol % of the red emitting 4-(dicyanomethylene)-2-methyl-6-julolidyl-9-enyl-4H-pyran (DCM2) in tris(8-hydroxyquinoline) Al ($Alq_3$). The S and T energies are determined from fluorescence at room temperature, and phosphorescence at 14K respectively, see EPAPS. Here, ADN has lower T (1.69 eV) and higher S energy (2.83 eV) than $Alq_3$ (T=1.99 eV and S=2.38 eV). Furthermore, S=2.03 eV and T=1.74 eV for DCM2. This system, therefore, is energetically consistent with FIG. 1.

The manager concentration in (100-x) vol % $Alq_3$ is x vol % ADN (x=0, 10, 30, 50, 70, 100). Blended films were deposited by thermal evaporation in high vacuum ($10^{-7}$ Torr) on quartz, Si, and 2 μm thick $SiO_2$-on-Si substrates for characterizing absorption, photoluminescence (PL), and triplet absorption, respectively. The same films were deposited on gratings with a period of 430 nm±5 nm and a 50 nm depth on the $SiO_2$-on-Si to form distributed feedback (DFB) OSLs. Output from a 0.6 W laser diode at wavelength λ=405 nm was focused to a 150 μm×250 μm spot to optically pump the thin film. $Alq_3$ and ADN pure film absorption coefficients were measured to be $4.8 \times 10^4$ $cm^{-1}$ and $9.1 \times 10^{-4}$ $cm^{-1}$ at λ=405 nm, and are assumed to contribute to the total blend film absorption proportionate to their volume. All measurements were performed in $N_2$ ambient to minimize film degradation.

Figure 2:
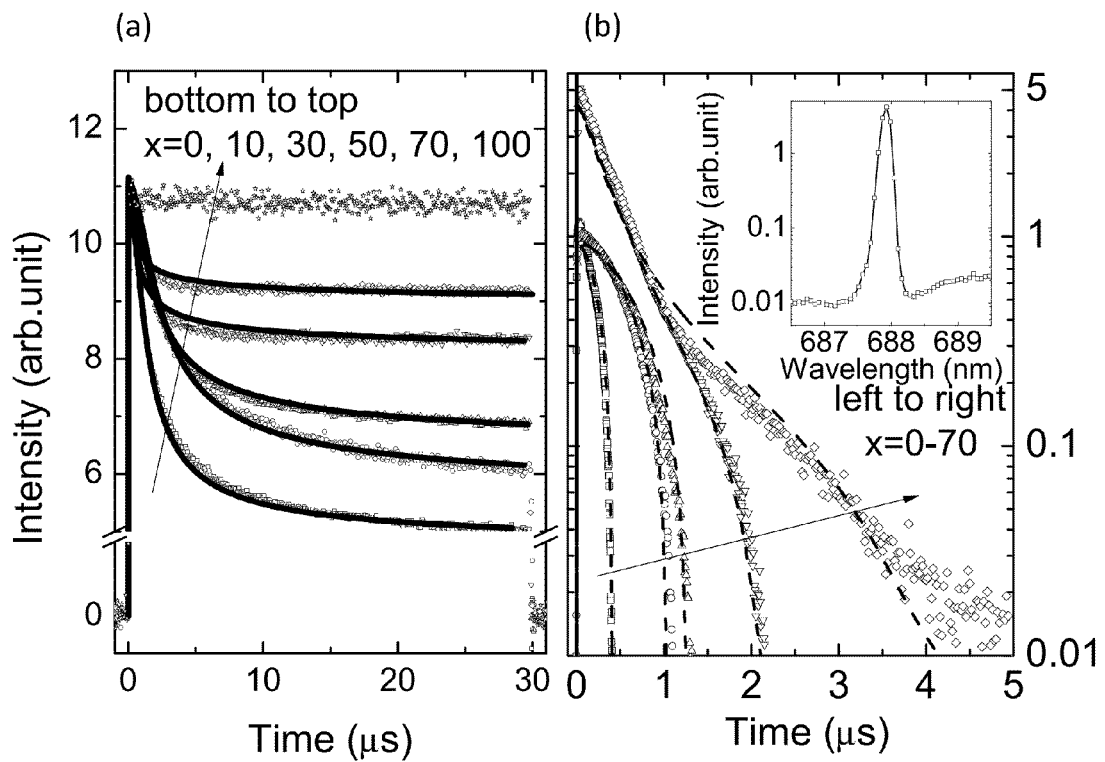
FIG. 2 shows (a) Photoluminescence (PL), and (b) lasing transients measured at 1.6 kW/cm$^2$ pump intensity for different host blends. The PL transients are normalized by the peak intensities, and lasing transients are normalized to 1 for x=0, 10, and 30 ADN blends, and to 5 for x=50 and 70. The fits are obtained by the model described in text with parameters summarized in Table 1. Inset: Lasing spectrum of an x=70 OSL.

FIGS. 2(a) and (b) shows the PL and lasing transients pumped at 1.6 $kW/cm^2$. From FIG. 2(a), the $Alq_3$ host undergoes a 55% reduction in PL to its steady state value within 30 μs of the onset of the pump. Previous studies have shown that this intensity roll-off is due to singlet quenching from S-T annihilation. That is, following the onset, the S density rapidly reaches a peak and subsequently decays due to annihilation by the slowly increasing T population. The existence of the long-term steady state PL intensity below its peak suggests saturation of the guest triplet population. By including the ADN manger into the host blend with x=10 to 70, the PL transient quenching is reduced to 17%. Further increasing to x>70 can eliminate quenching entirely. We infer, therefore, that triplets are transferred from $Alq_3$ to DCM2, while the transfer from ADN to DCM2 is forbidden, consistent with the triplet energy relation $T(Alq_3)>T(DCM2)>T(ADN)$. Note, however, that morphology degradation under high pump intensity occurs for x>50, consistent with the previous observation of morphological instability of ADN.

In FIG. 2(b), more than a ten-fold increase in lasing time (from approximately 400 ns to 4.5 μs) is observed when x increases from 0 to 70. Lasing is not observed for x=100 due to degradation. The inset shows a typical lasing spectrum of a 70% ADN OSL centered at λ=687.9 nm, with a full width half maximum of 0.15 nm limited by the spectrometer resolution. The threshold pulsed pump intensity, $I_{PS}$ (characterized by an abrupt spectral narrowing from >30 nm to <0.5 nm, and a significant increase in the slope efficiency) was obtained using a 30 ns pump pulse (Table 1).

TABLE 1

Parameters for PL and lasing transients fits, and the corresponding, measured pulsed ($I_{PS}$) and calculated CW ($I_{CW}$) lasing threshold intensities

| Device (% ADN) | $I_{TH}$† (kW/cm²) | $k_{HG}$* ($10^{10}$/s) | $k_{ISC}$* ($10^7$/s) | $N_0$* ($10^{18}$/cm³) | $\sigma_{TT}$† ($10^{-17}$ cm²) | $\sigma_{stim}$* ($10^{-16}$ cm²) | $I_{CW}$ (kW/cm²) |
|---|---|---|---|---|---|---|---|
| 0 | 0.93 | 4.0 | 3.3 | 5.0 ± 0.4 | 4.0 ± 0.3 | 1.9 | 32 |
| 10 | 0.75 | 3.5 | 2.6 | 3.9 ± 0.3 | 3.8 ± 0.3 | 2.0 | 19 |
| 30 | 0.72 | 13 | 2.3 | 2.8 ± 0.3 | 3.6 ± 0.4 | 2.4 | 8.8 |
| 50 | 0.45 | $3.0 \times 10^3$ | 1.7 | 1.5 ± 0.2 | 4.3 ± 0.6 | 2.1 | 3.7 |
| 70 | 0.43 | $5.0 \times 10^5$ | 1.3 | 0.92 ± 0.08 | 4.1 ± 0.4 | 2.3 | 2.2 |

†Parameters from measurement
*Parameters from fits to data

To understand the transient PL and lasing dynamics, we extend previous work' ENREF 8 to include triplet Dexter transfer from host blend to guest, and guest triplet saturation. Hence, the coupled laser rate equations are:

$$\frac{dS}{dt} = \frac{\eta I}{e_p d} - k_S S - k_{ISC} S - k_{ST} S T_G - \gamma \frac{c}{n_{eff}} P, \tag{1}$$

$$\frac{dT_H}{dt} = k_{ISC} S - k_{HG} \exp\left(-\frac{2}{L}\sqrt[3]{\frac{1}{N_0 - T_G}}\right) T_H, \tag{2}$$

$$\frac{dT_G}{dt} = k_{HG} \exp\left(-\frac{2}{L}\sqrt[3]{\frac{1}{N_0 - T_G}}\right) T_H, \tag{3}$$

-continued $$\frac{dP}{dt} = (\Gamma\gamma - \alpha_{CAV} - \Gamma\sigma_{TT}T_G)\frac{c}{n_{\textit{eff}}}P + \Gamma\beta k_S S, \quad (4)$$

where S, $T_H$, $T_G$, P are guest singlet, host blend triplet (including both ADN and $Alq_3$), guest triplet, and lasing mode photon densities, respectively, t is time, η is the fraction of the pump emission absorbed by the organic film, I is the pump intensity, $e_p$=3.06 eV is the pump photon energy, d=200 nm is the OSL gain medium thickness, $k_S$=(6.7±0.5)×$10^8$ $s^{-1}$ is the guest S natural decay rate (measured from a 2% DCM2:$Alq_3$ film excited by 1.5 ns width $N_2$ laser pulses), $k_{ISC}$ is the host ISC rate, $k_{ST}$ is the guest S-T annihilation rate, $\gamma=\sigma_{stim}S$ is the gain, $\sigma_{stim}$ is the stimulated emission cross-section, c is the speed of light, and $n_{\textit{eff}}$=1.6 and Γ=0.69 are the effective refractive index and optical confinement factor for the $SiO_2$ (n=1.48)/organic (n=1.82)/air (n=1) waveguide.[24] Also, $k_{HG}$ is the host-guest Dexter transfer coefficient, L is the guest-host van der Waals radius (~1 nm), $N_0$ is the guest triplet saturation population, $\alpha_{CAV}$ is the cavity loss without contributions from triplet absorption, $\alpha_{TT}$, and $\sigma_{TT}$ is the guest triplet absorption cross-section, and $\beta\approx10^{-4}$ is the spontaneous emission factor[25]. For PL, we have P=0, and the intensity is proportional to S. We assume that the host triplet population does not interact with S or P; this is tested by fits to the data as well as via direct triplet absorption measurements. Now, $N_0$ is determined from the saturation of PL quenching, and due to the balance of triplet transfer from $Alq_3$ to DCM2, and triplet trapping on ADN. Introducing $N_0$ avoids the complication of treating individual triplet transfer in the ternary blend.

Free parameters $k_{ST}$, $k_{ISC}$, $k_{HG}$, and $N_0$ are used in fitting the PL transients. To test for model consistency, transients at four different pump intensities (1.6, 1.3, 0.93, and 0.56 kW/$cm^2$) yield a single set of parameter values summarized in Table 1. For all films, $k_{ST}$=2.0×$10^{10}$ $cm^3$/s, as expected for guest S-T annihilation due to resonant energy transfer that is only dependent on DCM2 S emission and T absorption. As x increases, fewer triplets are transferred from $Alq_3$ to DCM2 and more are trapped on ADN; thus $N_0$ decreases from 5.0× $10^{18}$ $cm^{-3}$ to 9.2×$10^{17}$ $cm^{-3}$ when x=70, leading to decreased PL transient roll-off. The ~$10^5$ increase in $k_{HG}$ seems surprising, however, the Dexter transfer rate is determined by $$k_{Dex} = k_{HG}\exp\left[-\frac{2}{L}\sqrt[3]{\frac{1}{N_0 - T_G}}\right].$$

Thus, for $T_G$=0.7$N_o$, $k_{Dex}$ only increases from 7.6×$10^4$/s (x=0) to 4.4×$10^5$/s (x=70), consistent with the shorter PL quenching time for higher x.

To model the lasing transients in FIG. 2(b), three additional parameters, $\sigma_{TT}$, $\sigma_{stim}$, and $\alpha_{CAV}$ are required. Here, $\alpha_{TT}(\lambda)$ was measured following Lehnhardt, et al., Phys. Rev. B 81 (16), 165206 (2010). (see EPAPS), and $\alpha_{TT}=\alpha_{TT}/N_0$ is shown in Table 1 at λ=680 nm. The nearly constant $\alpha_{TT}(\lambda)$ spectra and $\alpha_{TT}$ for all x are consistent with the assumption that only guest triplet absorbs the lasing emission (i.e. host and manager absorptions are negligible). Furthermore, $\alpha_{CAV}=\Gamma\sigma_{stim}S_{PS}$, where $S_{PS}=\eta I_{PS}/(e_p dk_S)$ is the pulse threshold S population, where T build-up under short excitation pulses is negligible. With these measurements and assumptions, the lasing transients are fit using only a single free parameter, $\sigma_{stim}$ (Table 1). We note that the effect of ADN as a triplet manager lies in its ability to decrease $N_0$, while $k_{ST}$ and $\sigma_{TT}$ remain unchanged since they are intrinsic to DCM2.

The net gain g(t)=$\Gamma\sigma_{stim}$S(t)-$\alpha_{CAV}$-$\Gamma\sigma_{TT}T_G$(t)=0 determines the threshold S population dynamics, $S_{TH}$(t), which are plotted in FIG. 3 for the $Alq_3$ host (squares) and the optimized (x=70) blend host (stars), using parameters in Table 1. Surprisingly, two distinct threshold S populations emerge from the fits, with a CW threshold population ($S_{CW}$) occurring at a density larger than that needed for pulsed lasing ($S_{PS}$). As t→0, triplet loss $\Gamma\sigma_{TT}T_G\ll\alpha_{CAV}$ giving $S_{PS}=\alpha_{CAV}/(\Gamma\sigma_{stim})$. With time, $T_G$ increases, concomitantly increasing the associated loss until $\Gamma\sigma_{TT}T_G>\alpha_{CAV}$. Finally, $T_G$ reaches its saturation density, $N_0$, at which point the triplet loss can no longer increase, giving $S_{CW}=(\alpha_{CAV}+\Gamma\sigma_{TT}N_0)/(\Gamma\sigma_{stim})$. FIG. 3 also shows S(t) for several pump intensities, I, for the host-manager blend, with the lasing duration vs. I plotted in the inset. Due to the saturation of $T_G$ and thus $S_{TH}$, at I greater than the CW pump intensity threshold, $I_{CW}$=2.2 kW/$cm^2$, the lasing duration is no longer affected by triplet loss, and approaches infinity. Table I also gives $I_{CW}$ for all x in blended hosts. With larger $N_0$ and thus increased triplet loss, the $Alq_3$-host OSL has $I_{CW}$=32 kW/$cm^2$. Due to organic film damage at such high intensities, the CW lasing threshold in the absence of a manager has not been previously reported.

Neglecting the change in singlet population due to stimulated emission (c.f. Eq. (1)), the CW threshold is approximately:

$$I_{CW}(N_0) = e_p d(k_S + k_{ISC} + k_{ST}N_0)\frac{\alpha_{CAV} + \Gamma\sigma_{TT}N_0}{\eta\Gamma\sigma_{stim}}, \quad (5)$$

compared to the pulse threshold $I_{PS}=I_{CW}(N_0\approx0)$. From Eq. (5), $I_{CW}$ is a quadratic function of guest triplet saturation population: $k_{ST}N_0$ is from S-T quenching that reduces the gain; and $\Gamma\sigma_{TT}N_0$ is due to triplet absorption, increasing loss.

To test the existence of this CW regime, we excited an $Alq_3$/ADN (x=70)/DCM2 laser at 2.4 kW/$cm^2$, or just above the calculated value of $I_{CW}$ using the parameters in Table I. FIG. 3, left inset, shows a streak camera image of this emission over 20 μs duration. Lasing becomes weaker (leading to the apparent spectral narrowing) but does not turn off at the end of the long pulse, consistent with theory. Indeed, we observed nearly 100 μs lasing duration (see EPAPS) when pumped by a single pulse, although film degradation due to high optical pump intensities ultimately limits the lasing duration. Hence, while this OSL has clearly exceeded its CW threshold, the laser operates quasi-CW due to material degradation.

Interestingly, the lasing wavelength blue shifts from λ=688.1 nm to 687.7 nm during the lasing period, shown in FIG. 3, left inset. Wavelength shifts have been observed in liquid dye lasers where they have been attributed to the competition of triplet absorption with the gain spectrum. In thin film single mode DFB OSLs where the triplet absorption is largely constant (see EPAPS), the shift is more likely due to changes in the effective refractive index with increasing T density.

We note that $I_{CW}$ can be further reduced and the lasing time extended by using a more stable, lower triplet energy manager, and with a better match between the manager emission and the guest absorption than is achieved with ADN. Then, the smaller saturation guest triplet population contributes negligible loss, in which case $I_{CW}\rightarrow I_{PS}$. The design concept can be applied to the eventual development of electrically pumped organic semiconductor lasers, where 75% of the injected electrons result in triplets compared to only a few percent in optical pumping.

In conclusion, we show the existence of a CW threshold at a higher pump intensity than the pulsed threshold observed in all previous OSL studies. Based on our analysis, we demonstrate a lasing duration of up to 100 μs by introducing a triplet manager into the OSL gain medium. The reduced triplet-induced loss of the triplet managed OSL decreases $I_{CW}$ from 32 kW/cm$^2$ to a more practical value of 2.2 kW/cm$^2$ observed here.

Measurements

Figure 4A:
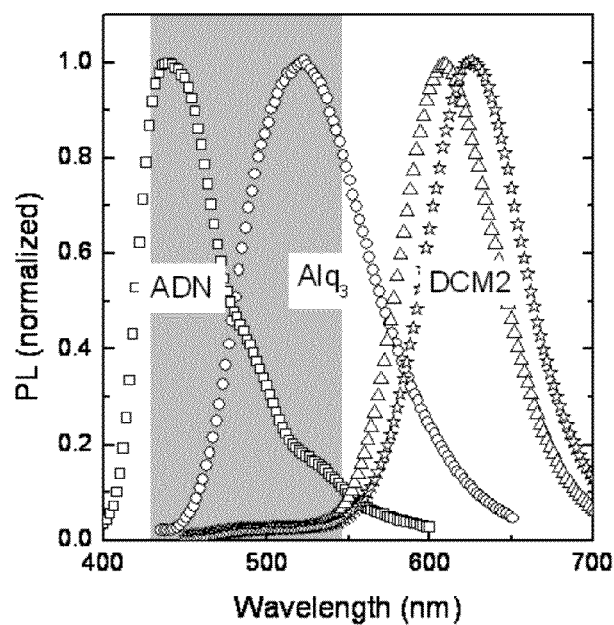
FIG. 4 shows: 4(a) Photoluminescence (PL) spectra of thin film ADN (squares), Alq$_3$ (circles), and DCM2 doped in an x % ADN/(100–x) % Alq$_3$ blend with x=0 (stars) and 70 (triangles). The shaded region corresponds to where the DCM2 absorption coefficient is >4×10$^4$ cm$^{-1}$, implying efficient energy transfer from both ADN and Alq$_3$. 4(b) phosphorescence of Alq$_3$, DCM2, and ADN measured at 14 K, the fits are to double-peak Gaussian for Alq3 and single-peak Gaussians for the rest.

The singlet energy is derived from the peak of PL spectrum in FIG. 4(a) for ADN (S=2.83 eV), Alq3 (S=2.38 eV), and DCM2 (S=2.03 eV). The spectral overlap of the ADN and Alq$_3$ PL and DCM2 absorption, together with DCM2 emission in the lightly doped films, indicates efficient and complete Förster transfer of singlets generated in both host and manager to the guest. The 17 nm bathochromic shift in PL for the doped film is due to the solid-state solvation effect.

Figure 4B:
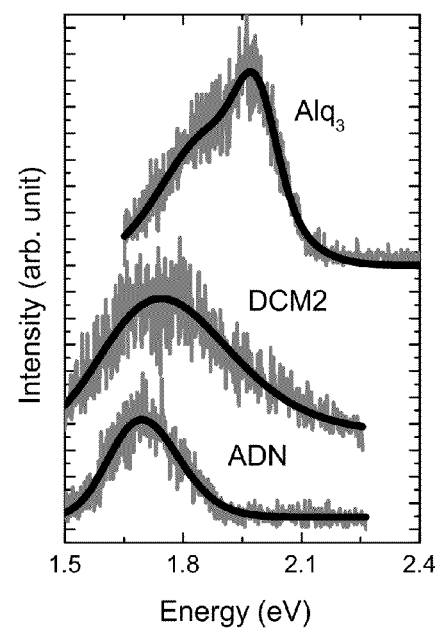

Triplet energies of the three fluorescence molecules are measured using the method of Tanaka et al., Phys. Rev. B 71 205207 (2005). Due to the negligible triplet emission of the fluorophores, the two phosphors: tris(2-phenylpyridine)Ir (III) (Ir(ppy)$_3$), T=2.4 eV) and bis(2-phenylquinoline)(acetylacetonate)Ir(III) (PQIr), T=2.1 eV) are co-doped with the material under study to enable efficient transfer of photogenerated triplets from the phosphor to the fluorophore, thereby overcoming its low intersystem crossing rate. The triplet energy of the phosphor is lower than the fluorophore singlet, but higher than its triplet for transfer to occur. Photoluminescence at 14K from the blends: Alq$_3$(25%)/Ir(ppy)$_3$(75%), DCM2(50%)/PQIr(50%), and ADN(50%)/Ir(ppy)$_3$(50%) using a N$_2$ pump laser (1 ns pulse) are measured using a streak camera (Hamamatsu C4334). The spectra at 0.4 ms to 9 ms after the pump pulses are shown in FIG. 4(b). Triplet energies of Alq$_3$ (T=1.99 eV), DCM2 (T=1.74 eV), and ADN (T=1.69 eV) are extracted from fits to Gaussians (solid lines). The Alq$_3$ triplet energy is consistent with that obtained by Tanaka, et al., Phys. Rev. B 71 205207 (2005).

Figures 5A, 5B:
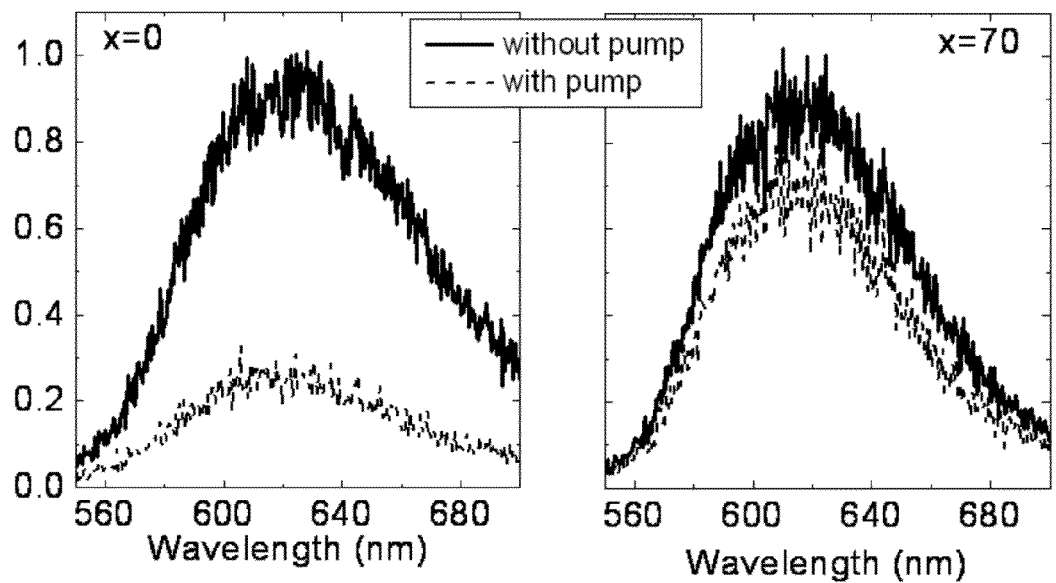
FIG. 5 shows a probe pulse PL spectrum with and without the pump pulse for (a) x=0; and (b) x=70 films. The 200 nm film was grown on SiO$_2$ (2 µm)/Si substrate.
Figure 6:
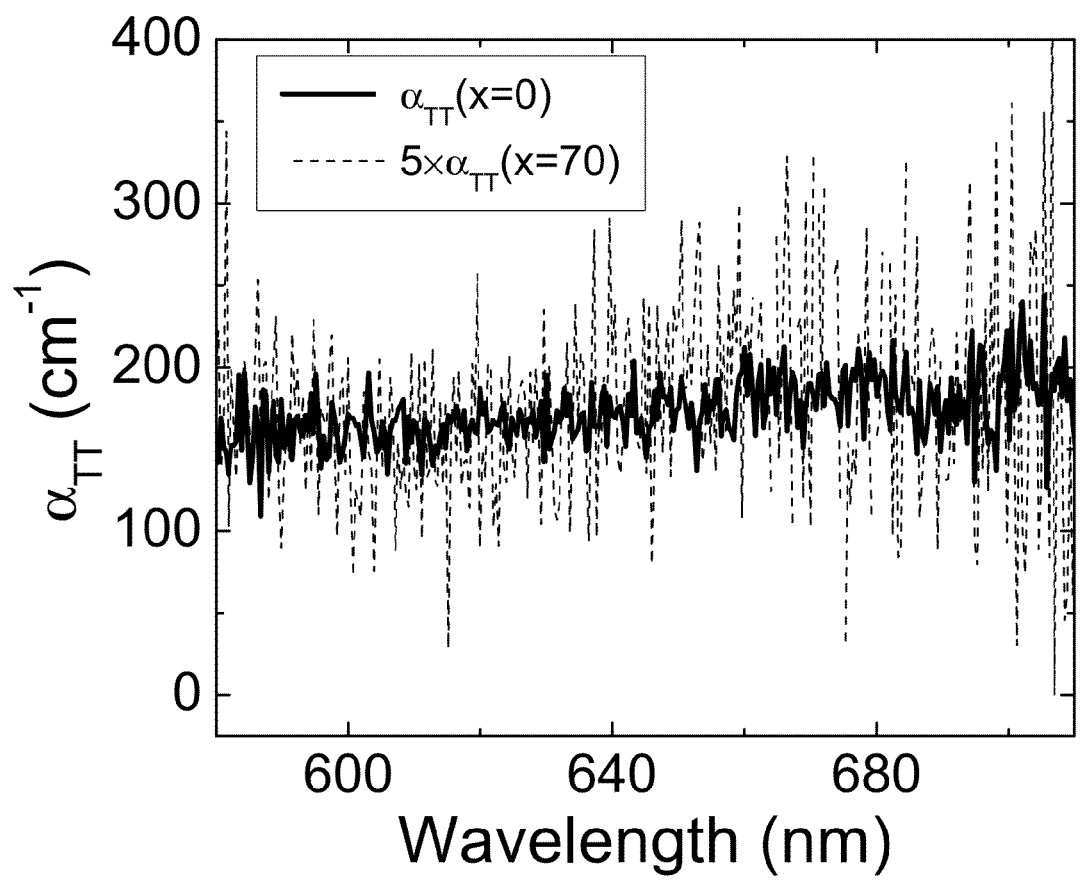
FIG. 6 illustrates the calculation of an absorption coefficient for x=0 and 70 from the data in FIG. 5.
Figure 7:
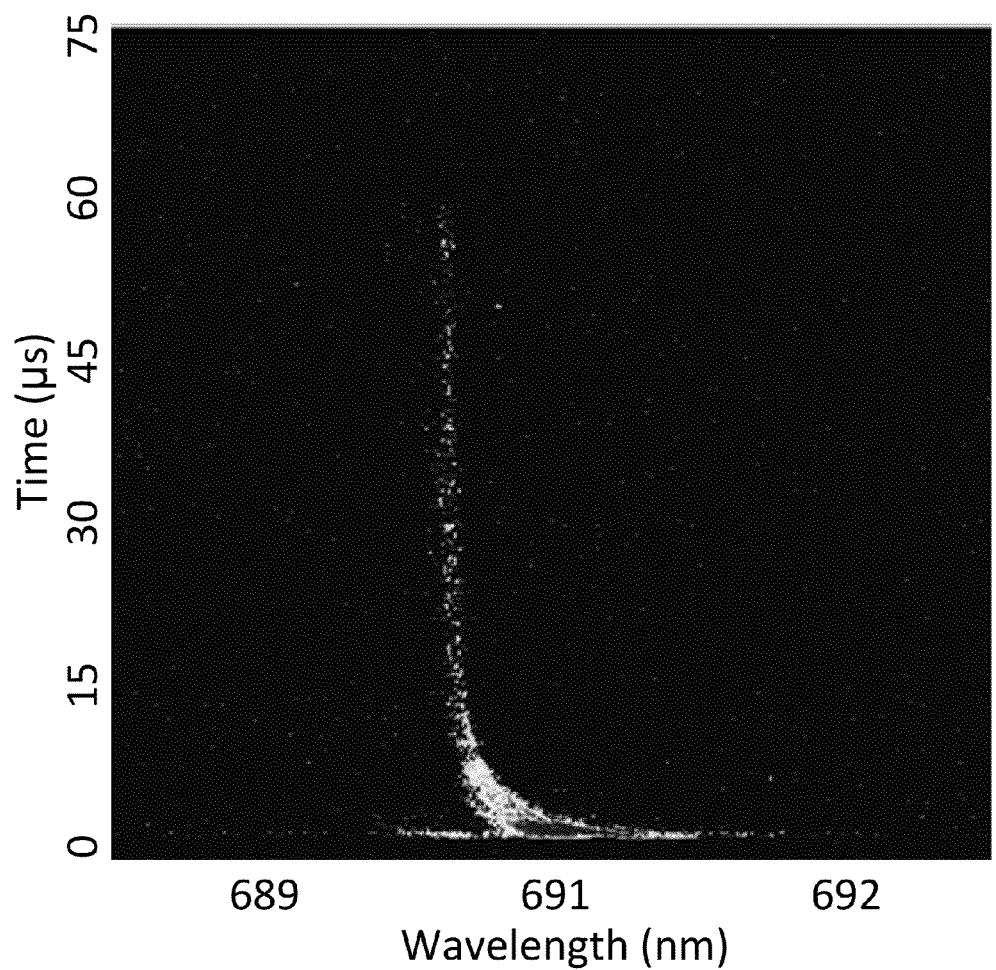
FIG. 7 shows a streak camera image of laser emission for x=70 triplet managed OSL measured at 2.4 kW/cm$^2$ pump intensity and 100 µs pulse width integrated over 10 pulses. Note that the color map uses logarithm scale. Lasing duration (characterized by narrow spectrum) is approximately 55 µs.

The triplet absorption is measured through spatially separated pump probe experiment proposed by Lehnhardt et al., Org. Electron. 12 486 (2011). The pump pulse from a k=405 nm laser diode has 50 μs duration, saturating the guest triplet; the probe pulse from a N$_2$ (1.5 ns width) laser is applied 100 ns after the turn-off of the pump. The film PL is collected from the film edge by either a streak camera (Hamamatsu C4334) for absorption spectrum $\alpha_{TT}(\lambda)$ measurement, or through a λ=680±5 nm band-pass filter by an avalanche photodiode (C5658) for $\alpha_{TT}$ near the lasing wavelength with a smaller error. FIG. 5 shows the PL intensity from the probe with and without the pump pulse for x=0 and 70 films. We can see the triplet absorption is significantly reduced with introducing the triplet manager. From FIG. 5, two similar broad and featureless $\alpha_{TT}(\lambda)$ are obtained in FIG. 6, confirming that the absorptions are from the same excited state (guest triplet). As described above, the ~5 times difference is from the different guest triplet saturation population, $N_0$.

Enhanced Efficiency in High-Brightness Fluorescent OLEDs

The inventors have also demonstrated enhanced efficiency in high-brightness fluorescent organic light emitting diodes through triplet management.

In particular, the inventors have demonstrated singlet-triplet (S-T) quenching, and hence increased quantum efficiency, in high-brightness fluorescent organic light emitting diodes (OLEDs) by reducing the guest triplet population through the introduction of a triplet manage molecule into the emission layer (EML). As an example, an OLED whose EML consists of the red fluorophore, 4-(dicyanomethylene)-2-methyl-6-julolidyl-9-enyl-4H-pyran doped into the host, tris(8-hydroxyquinoline) Al (Alq$_3$) is blended with the triplet manager, 9,10-di(naphtha-2-yl)anthracene. The manager triplet energy is less than that of the host or dopant, leading to efficient triplet removal from the dopant without affecting the radiative singlet population. Measurements suggest the complete suppression of S-T quenching using the triplet management strategy, leading to grater than 100% increase in the steady state OLED external quantum efficiency.

Efficiency loss in fluorescent organic light emitting diodes (OLEDs) has been variously attributed to singlet polaron (S-P) quenching charge imbalance, and singlet-triplet (S-T) quenching. In the case of S-T quenching, the efficiency reduction is proportional to the product of the triplet (T) population and the quenching rate. Since 75% of the injected charge results in the formation of non-radiative triplets with relatively long lifetimes (typically >1 ms) compared to radiative singlets (~1-10 ns), triplets in OLEDs can reach a high density (>10$^{18}$ cm$^{-3}$). Also. fluorescent OLEDs often utilize a laser dye as the emitter, which usually has a resonance between the S emission and T absorption spectra, leading to a large S-T quenching rate. The combined large T population and high S-T quenching rate can reduce the OLED efficiency.

The conventional emission layer (EML) of a fluorescent OLED consists of a conductive host and an emissive guest. Because the guest often has lower S and T energies than the host, both excitonic species formed on the host transfer to the guest where S-T quenching occurs. One strategy to reduce quenching is to blend a "triplet manager" molecule into the EML to collect triplets, as shown again in FIG. 1. If the T manager has a higher S and lower T energy than the guest, it facilitates Förster transfer of S excitons to the guest and Dexter transfer of T excitons from the guest to the manager, thereby potentially eliminating guest S-T annihilation. Here, we demonstrate the effectiveness of such a strategy in OLEDs with EMLs comprising a tris(8-hydroxyquinoline) Al (Alq$_3$) host, doped with 2 vol. % of 4-(dicyanomethylene)-2-methyl-6-julolidyl-9-enyl-4H-pyran (DCM2). Various concentrations (0≤x≤70 vol. %) of 9,10 di(naphtha-2-yl)anthracene (ADN) are blended in the EML for T management.

The OLEDs were fabricated in vacuum (~10$^{-7}$ Torr) by thermal evaporation on pre-patterned indium-tin-oxide (ITO)-coated glass substrates following standard procedures. The 25 nm-thick EML is sandwiched between a 35 nm thick 4,4'-bis[N-(1-naphthyl)-N-phenyl-amino]-biphenyl (NPD) hole transport layer (HTL) and a 25 nm thick bathocuproine (BCP) electron transport layer. The array of 1 mm$^2$ devices is completed by depositing 0.8 nm thick LiF and 100 nm thick Al through a shadow mask to define the cathodes. The steady state current density-voltage-luminance (J-V-L) characteristics were measured at <0.3 A/cm$^2$ using a parameter analyzer and a calibrated Si photodetector. At higher currents of 0.1-2.5 A/cm$^2$, the electroluminescence (EL) intensity was measured using a pulse generator (100 μs pulse width and an avalanche photodiode.

With reference again to FIG. 4(a), which shows the photoluminescence (PL) specta of ADN and Alq$_3$ films and the EL spectra for OLEDs with EMLs with x=0 and 50% ADN. The PL spectral overlap with the DCM2 absorption (shaded box) and the pure DCM2 OLED emission confirm the complete Förster-transfer of singlets to the guest. The triplet energies of the three molecules are measured at 14 K using the method of triplet energy transfer from a sensitizing iridium complex. From FIG. 4(b), the inventors measured triplet energies of Alq$_3$ (T=1.99 eV), DCM2 (T=1.74 eV), and ADN (T=1.69 eV), which are consistent with the requirements shown in FIG. 1.

Evidence that ADN suppresses triplet transfer to DCM2 is inferred from the triplet absorption coefficients ($x_r$) for 200 nm thick films of 2% DCM2 doped in ADN and Alq$_3$ on SiO$_2$, in FIG. 8 (inset). The triplet state is populated by a 1.6 kW/cm$^2$, 50 μs, λ=405 nm wavelength pump laser diode through intersystem crossing from the singlet, and the absorption is measured by transmission of the PL excited by a 5 μJ/cm$^2$, 1.5 ns λ=337 nm N$_2$ laser pulse delayed 100 ns from the pump. Since $x_r = \Gamma_T T_G$, where $\sigma_T$ is the guest triplet absorption cross-section, and $T_G$ is its density, the elimination of $x_r$ by ADN is due to the successful removal of triplets from DCM2. Further, the negligible excited state absorption for the DCM2-doped ADN film also indicates that the ADN triplet absorption vanishes in the DCM2 PL spectral range.

FIG. 8(a) shows the transient EL for a series of OLEDs with different ADN fractions, x, following the onset of a J=2 A/cm$^2$ current step. For the control device (x=0), the EL rapidly reaches a peak and then decays to a steady state intensity ~50% of its initial value during the following 20 μs. Since the EL intensity is proportional to the S density, the transient decay is an indication of S-T quenching. Following the onset of the current pulse, the S population rapidly approaches its peak in the absence of triplets. As current is maintained, the long lifetime (~ms) triplet population increases, resulting in increased S-T quenching, and thus a decreased S population. Finally, when the guest T population approaches steady state, S-T quenching also stabilizes, giving rise to a reduced steady-state S population.

In the presence of the T manager, the magnitude of the EL transient decay reduces with increasing x and disappears for x≥50%, indicating the complete suppression of S-T quenching. FIG. 9 shows the EL intensity peak-to-steady-state ratio, ρ(J) for OLEDs in FIG. 8(a). It was determined that ρ(J) decreases with increased manager concentration, and ρ(J)=1 for x≥50%, corresponding to zero transient decay.

Two processes dominate energy transfer in triplet-managed OLEDs, namely guest S-T quenching, $S+T_G \to S_o+T_G$ (So is the ground state), and host-to-guest triplet Dexter transfer, $T_H$ includes both Alq$_3$ and ADN triplets). The EL may be modeled using:

$$\frac{dS(t)}{dt} = b\frac{1}{4}\frac{J}{ed} - \frac{S(t)}{\tau_S} - k_{SC}S(t)T_G(t), \quad (1)$$

$$\frac{dT_H(t)}{dt} = b\frac{3}{4}\frac{J}{ed} - k_{HG}\exp\left(-\frac{2}{L}\sqrt[3]{\frac{1}{N_{GT}(J) - T_G(t)}}\right)T_H(t), \quad (2)$$

$$\frac{dT_G(t)}{dt} = k_{HG}\exp\left(-\frac{2}{L}\sqrt[3]{\frac{1}{N_{GT}(J) - T_G(t)}}\right)T_H(t), \quad (3)$$

where b is the charge imbalance factor, e is electron charge, d is the EML thickness assuming that excitons are uniformly distributed across this layer, $\tau_s$ is the singlet natural decay lifetime, and $k_{st}$ is the S-T quenching rate. Also, $k_{HG}$ and L are the host-to-guest triplet transfer rate coefficient and van der Waals radius, respectively, and $N_{GT}(J)$ is the saturation guest T population; i.e. when $T_G(t) \to N_{GT}(J)$, the transfer stops and $dT_G/dt=0$. This treatment assumes 25% of injected charges from singlets. The exponential factors are due to diffusive transfer of excitons between molecules consistent with the Dexter process. Eventually, $T_H$ saturates due to triplet-triplet (T-T) quenching and natural decay, but these processes are much slower (~1 ms) than the time window of interest (~30 μs) and are thus neglected. Singlet-singlet (S-S) quenching is not considered since it is negligible at such low densities.

Finally, S-P quenching is also possible; however, it cannot result in the observed EL transients since the polaron density reaches steady state within tens of ns following the onset of the current pulse.

Assuming the boundary condition that $T_G=0$ at t=0, and $T_G=N_{GT}$ as t→∞ in Eq. (1), ρ(J) is $$\rho(J) = 1 + \tau_s k_{ST} N_{GT}(J).$$

The external quantum efficiency roll-off is then given by $EQE(J) = \eta_o \eta_C(J) \eta_T(J)$, where $\eta_o$ is external quantum efficiency (EQE) with perfect charge balance and no singlet quenching, $\eta_C(J)$ is the roll-off due to charge imbalance and S-P quenching, and $\eta_T(J) = 1/\rho(J)$ is the roll-off due to S-T quenching.

From the PL transients measured for 50 nm thick films using an N$_2$ laser pump, $\tau_s$=1.5±0.2 ns for DCM2:ADN/Alq$_3$, independent of the manager concentration. For a 2 vol. % DCM2 concentration, L≈3 nm as determined from the average distance between dopant molecules. With the constraint on $N_{GT}(J)$ given by Eq. (4), and for perfect charge balance (b=1), the EL transients are fit by Eqs. (1)-(3) as shown by the solid lines in FIG. 8(a). From the fits, $k_{ST}$=1.5×10$^{-10}$ cm$^3$/s, independent of host and manager concentrations, and is similar to previous values obtained for DCM:Alq$_3$. Also, it was found that $k_{HG}$=2.5×10$^7$ s$^{-1}$ for x=0 and 10%, and $k_{HG}$=3×10$^8$ s$^{-1}$ for x=30% ADN.

With these fits, we obtain $N_{GT}$ using Eq. (4), with results also indicated in FIG. 9. Clearly, the introduction of the triplet manager substantially reduces $N_{GT}$. For example, at J=0.5-2.5 A/cm$^2$, $N_{GT}(J)$ is reduced from 4×10$^{18}$ cm$^{-3}$ (x=0) to <3×10$^{17}$ cm$^{-3}$ (x=30%) and 0 cm$^{-3}$ (x≥50%).

FIG. 10(a) shows EQE(J) for different ADN concentrations. For x=0-50%, the EQEs at low J (<10$^{-4}$ A/cm$^2$) are similar at ~3%, while the EQE roll-off with J is reduced at higher x. At high currents (J>0.1 2.5 A/cm$^2$), the EQE at x=50% is enhanced by more than 100% from x=0 due to reduced roll-off. The separate contributions from polaron and triplet-induced roll-off are plotted in FIG. 10(b). Here, $\eta_T(J)$ is obtained from ρ(J), while $\eta_C(J)$ is solved assuming $\eta_o$=3% obtained at J→0. From FIG. 10(b), reduced S-T quenching is the major contribution for the enhanced EQE at x=50%, while polaron-induced roll-off is also slightly reduced at x=50% due to bipolar charge transport in ADN. That is, while both ADN and Alq$_3$ are good electron transporting materials, ADN has a higher hole mobility. This can result in more efficient recombination, and thus a smaller free carrier density in the EML. In turn, this reduces the S-P quenching and thus slightly increases $\eta_C(J)$.

In contrast, EQE decreases when x increase from 50% to 70%, though in both cases, ρ=1. This is attributed to reduced $\eta_C(J)$ at x=70% due to charge imbalance. Since the NPD lowest unoccupied molecular orbital (LUMO) is at 2.3 eV, the electron blocking barrier at the HTL/EML interface is smaller for ADN (with a LUMO at 2.6 eV) than for Alq$_3$ (LUMO=3.1 eV). Thus, at high ADN concentrations electrons preferentially transport on ADN and more readily escape from the EML without recombination. This is evident from FIG. 10(a), inset, where x=70% shows significantly higher current at x<50%. Thus, the host (Alq$_3$) cannot be completely replaced by the triplet manager to ensure that charge balance is maintained.

T.-H. Liu, C.-Y. Iou, and C. H. Chen, Curr. Appl. Phys. 5(3), 218 (2005), which is incorporated herein by reference in its entirety, used ADN and rubrene as co-hosts in an OLED based on the fluorophore, 4-(dicyanomethylene)2-t-butyl-6-(1,1,7,7-tetramethyljulolidyl-9-enyl)-4H-pyran (DCJTB), doped into Alq$_3$ to reduce the high intensity, steady state EQE roll-off. The enhanced EQE was explained by reduced singlet-charge ($Alq_3^-$) quenching. The inventors analysis differs from that of Liu et al., where the transient efficiency indicates that reduced S-T quenching is the principal cause of the enhanced EQE. It should be noted that rubrene (T=1.1 eV (shown in M. Montalti, A. Credi, L. Prodi, and M. T. Gandolfi, *Handbook of Photochemistry*, $3^{rd}$ ed. (CRC. Boca Raton, Fla. 2006) p. 83, which is incorporated herein by reference in its entirety)) can also be effectively employed as a triplet manager although data for rubrene:$Alq_3$:DCM2 devices are omitted for brevity.

In conclusion, the inventors have demonstrated that triplet managers blended into the EML of fluorescent OLEDs can lead to a significant increase in quantum efficiency at high current density. The manager molecules promote efficient triplet transfer from the guest, thereby reducing S-T quenching at high currents. Such a management strategy can be generally applied to fluorescent OLEDs that suffer S-T quenching to achieve very high brightness, and has also been shown to be effective in allowing organic semiconductor lasers to enter the continuous wave operation regime.

Previous studies have shown that triplet induced losses including both singlet-triplet quenching and triplet absorption are significant obstacles for electrically pumped organic semiconductor lasers (OSLs). In view of the above and provided herein, a triplet management method that could eliminate (or reduce) the triplet induced losses in OSLs is provided and thus opening a new route for the development of electrically pumped OSLs.

The triplet induced losses in conventional OSLs (including both small molecules and polymers) originate from the spectrum overlap of the laser emission and triplet state absorption. The triplet management strategy involves doping the laser gain medium by an additional molecule, called triplet manager, which may have the following features: 1. the manager triplet energy is lower than all other molecules already existed in the gain medium; 2. the manager triplet absorption is negligible at the lasing wavelength. Once these two features are satisfied, triplet induced loss may be eliminated or significantly reduced. The effectiveness of using 9,10-di(naphtha-2-yl)anthracene (ADN) or rubrene as triplet managers in the conventional small molecule guest-host gain medium of 4-(dicyanomethylene)-2-methyl-6-julolidyl-9-enyl-4H-pyran (DCM2) doped tris(8-hydroxyquinoline) aluminum ($Alq_3$) was demonstrated above. By optical pumping, the ADN managed laser has a lasing duration of nearly 100 μs compared to only 400 ns of the conventional non-managed laser.

Using the same triplet management strategy in the emission layer (EML) of a fluorescent organic light emitting diode (OLED), the inventors discovered complete suppression of triplet induced loss and thus more than 100% efficiency enhancements. This was also demonstrated by using ADN or rubrene as triplet manager in DCM2 doped $Alq_3$ EML of an OLED.

Figure 11D:
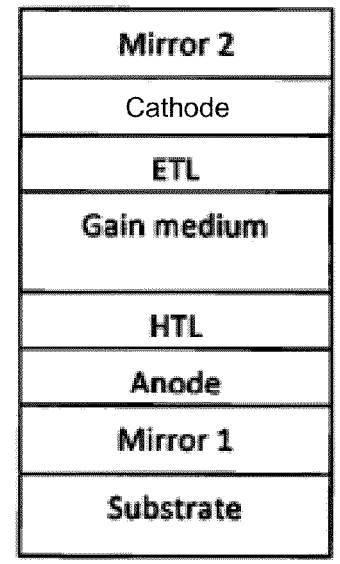

As provided herein, the inventors found that the two approaches described above could be combined for an electrically pumped OSL. A laser consists of a gain medium and a feedback structure. The gain medium of the electrically pumped OSLs utilizes a triplet management strategy, e.g. a triplet manager molecule doped in an otherwise conventional polyfluorene or small molecule guest-host system. The feedback structure can have any suitable form, such as the examples provided in FIGS. 11(a)-(d). For example, FIG. 11(a) shows a planar waveguide feedback, with feedback provided by reflection from the edge surface. FIG. 1(b) shows the distributed feedback (DFB), with feedback given by the diffraction of the grating. FIG. 11(c) shows the planar distributed Bragg reflector feedback (DBR), with feedback provided by the reflection from the DBR parallel to the substrate. FIG. 11(d) shows the vertical cavity structure surface emitting structure (VCSEL), with the feedback given by the reflection from front and back mirror. However, as would be appreciated by one of ordinary skill in art after reading this disclosure, any suitable feedback system or apparatus may be used.

In general, the material choice and thickness for the anode, hole injection layer (HTL), electron injection layer (ETL) and cathode in an OSL may be the same as for conventional OLEDs. The gain medium thickness may be in the range of 50 nm-300 nm. The substrate should preferably have a refractive index less than organic films (n~1.6-1.8), and is typically quartz or $SiO_2$, but may comprise any suitable material. In the exemplary feedback structures shown in FIGS. 11(a)-(c), the feedback is parallel to substrate; whereas in the exemplary structure shown in FIG. 11(d), the feedback is perpendicular to substrate.

The lasing threshold current density for the exemplary electrically pumped OSLs may be calculated as follows. The threshold condition is given by:

$$g(t) = \Gamma\sigma S(t) - \alpha - \Gamma\sigma_{TT}T(t) > 0,$$

where t is time, g is the net gain, $\Gamma$ is the optical confinement factor, $\sigma$ is the stimulated emission cross section, $\alpha$ is the cavity loss, $\sigma_{TT}$ is the triplet absorption cross-section, and S and T are singlet and triplet densities, respectively. Now, with triplet managers, the triplet induced losses can be eliminated, thus:

$$g(t) = \Gamma\sigma S(t) - \alpha > 0 \text{ and } \frac{dS(t)}{dt} = \frac{J}{4ed} - \frac{S(t)}{\tau},$$

where d is the gain medium thickness (EML thickness in OLEDs), e is the electron charge, and $\tau$ is the singlet lifetime. Then, threshold current density is $J_{th}=4ed\alpha/\Gamma\tau\sigma$ (note that $\alpha$ and $\Gamma$ are not independent). With typical values of d=50 nm, $\Gamma=0.3$, $\alpha=10\ cm^{-1}$, $\tau=2$ ns, and $\alpha=4\times10^{-17}\ cm^2$, then it can be calculated that $J_{th}=1.3\ kA/cm^2$. According to previous studies, such high current density is generally reachable in organic semiconductor materials. If triplet losses exist, the threshold current densities will be significantly higher (See N. C. Giebink and S. R. Forrest, "*Temporal response of optically pumped organic semiconductor lasers and its implication for reaching threshold under electrical excitation*," Phys. Rev. B 79 (7), 073302 (2009) at FIG. 3(b), which is incorporated by reference herein in its entirety).

Besides triplet loss, contact loss and polaron loss are also considered as obstacles for electrically injected OSLs. One recent study disclosed in M. Reufer, S. Riechel, J. M. Lupton, J. Feldmann, U. Lemmer, D. Schneider, T. Benstem, T. Dobbertin, W. Kowalsky, A. Gombert, K. Forberich, V. Wittwer and U. Scherf, "*Low-threshold polymeric distributed feedback lasers with metallic contacts*," Appl. Phys. Lett. 84 (17), 32623264 (2004) at p. 8, which is incorporated herein by reference in its entirety, showed that the contact loss can be eliminated by carefully tuning the waveguide mode. Polaron absorption was previously measured to be similar to triplet absorption, but it can be mitigated by using high conductivity materials to reduce the polaron concentration. This is because the equilibrium polaron population decreases with increasing the mobility by: $n\alpha 1/\sqrt{\mu}$, where $\mu$ is the mobility of the film.

Exemplary Embodiments

A first device is provided. The device includes an organic semiconductor laser. The organic semiconductor laser further includes an optical cavity and an organic layer disposed within the optical cavity. The organic layer includes: an organic host compound; an organic emitting compound capable of fluorescent emission; and an organic dopant compound. The organic dopant compound may also be referred to herein as a "triplet manager." The triplet energy of the organic dopant compound is lower than or equal to the triplet energy of the organic host compound. The triplet energy of the organic dopant compound is lower than or equal to the triplet energy of the organic emitting compound. The singlet energy of the organic emitting compound is lower than or equal to the singlet energy of the organic host compound.

The energy relationships described allows the organic dopant compound to drain triplets from the organic host compound and the organic emitting compound, and to avoid transfer of triplets from the organic dopant compound to the other compounds. The organic dopant compound also preferably has a triplet lifetime that is short relative to the organic host and organic emitting compounds, so that the organic dopant compound can drain many triplets over a period of time.

Triplet and singlet energies for a wide variety of compounds are readily available in the literature. Some of that literature is described herein. These energies may be measured, and they may also be calculated. There may be some differences in the values obtained from various measurement and calculation techniques. For purposes of comparing energies to see whether one is greater or less than another, it is preferred that the same or similar measurement or calculations be used to obtain the values to be compared. If a particular measurement or calculation tends to overestimate or underestimate energy values, using the same measurement or calculation to obtain all values being compared will minimize any such effect.

The use of the term "or equal to" with regard to the singlet energy of the organic emitting compound in comparison to the singlet energy of the organic host compound is intended to take into consideration the possibility for endothermic transfer. These endothermic processes are described in more detail in U.S. Pat. Pub. No. 2005/0214576 filed on May 3, 2005, which is incorporated herein by reference in its entirety. Thus, while it may generally be preferred that the singlet energy of the organic emitting compound is lower than the singlet energy of the organic host compound, embodiments are not necessarily so limited.

In some embodiments, in the first device as described above, the organic semiconductor laser may further comprise a hole injection layer disposed between the anode and the hole transport layer, and an electron injection layer disposed between the cathode and the electron transport layer. As noted above, the device (and/or the OSL) may comprise some or all of the organic layers that are typically utilized in conventional OLEDs.

Preferably, the singlet energy of the organic emitting compound is lower than the singlet energy of the organic dopant compound.

This energy relationship minimizes transfer of singlets from the organic emitting compound to the organic dopant compound, so that the singlets on the organic emitting compound may desirably emit a photon.

Preferably, the organic dopant compound does not strongly absorb the fluorescent emission of the organic emitting compound.

By stating that the dopant compound "does not strongly absorb" the fluorescent emission of the emitting compound, it is meant that the ground, singlet excited and triplet-triplet excited states all have low absorption of the spectrum emitted by the fluorescent emitting compound. One of skill in the art can ascertain whether there is low absorption by observing plots of the emission and absorption spectra on the same graph, and checking whether there is significant overlap—some small overlap in the tail regions is permissible.

In one embodiment, the first device further includes an optical pump optically coupled to the organic layer.

For example, an optical pump 170 may be optically coupled to an organic emissive layer, e.g. EML 135, such as schematically shown in FIG. 12. As will be understood by those of skill in the art, the location of the optical pump may vary, for example based on the transparency or opaqueness of layers in the OLED stack, e.g. substrate 110, anode 115 and/or cathode 160.

In one embodiment, the organic semiconductor laser further includes an anode and a cathode. The organic layer is disposed between the anode and the cathode. A hole transport layer is disposed between the organic layer and the anode. An electron transport layer is disposed between the organic layer and the cathode. The organic dopant compound is present only in the emissive layer.

FIG. 13 shows an organic light emitting device 100. The figure is not necessarily drawn to scale. Device 100 may include a substrate 110, an anode 115, a hole injection layer 120, a hole transport layer 125, an emissive layer 135, an electron transport layer 145, an electron injection layer 150, and a cathode 160.

Preferably, the triplet decay time of the dopant compound is shorter than the triplet decay time of the emitting compound.

Preferably, the concentration of the dopant compound is 10 wt %-90 wt %, and the concentration of the emitting compound is 0.5 wt %-5 wt %.

In one embodiment, the host may be completely absent from the organic layer, i.e., the organic layer includes only the emitting compound and the dopant compound. In this situation, the concentration of the emitting compound is preferably 0.5 wt %-5 wt %, with the remainder of the layer being the dopant compound. The preferred energy level relationships described herein for the dopant compound and the emitting compound still apply to this embodiment. The device may still include other organic layers, such as hole transport and electron transport layers—this embodiment relates to a two-component emitting layer having the dopant and the emitting compound, but the rest of the device may have any of the other components described herein.

Preferably, the organic emitting compound is capable of fluorescent emission at room temperature.

Preferably, the dopant compound is selected from the group consisting of: anthracene, tetracene, rubrene, and perylene and their derivatives. More preferably, the dopant compound is selected from anthracene and its derivatives are particularly preferred. More preferably, the dopant compound is ADN.

In some embodiments, the dopant compound is a phosphor.
In some embodiments, the dopant compound is a fluorophore.

It is preferable to maximize the transfer of singlets from the host and dopant to the emitting compound. The co-system of host and dopant (without an emitting compound) may have different emission spectra for different dopant concentrations. For an optimized concentrations, the overlap between this emission spectra and the guest absorption spectrum is maximized. The result of such maximization is increased or possibly complete singlet transfer to the emitting compound. This is a more detailed condition than the condition that the singlet energy of the emitting compound is simply less than the singlet energy of the host and the singlet energy of the dopant.

It is preferable to maximize the transfer of triplets from the host and the emitting compound to the dopant. A higher dopant concentration will result in more efficient triplet transfer from the emitting compound and the host to the dopant. This is a more specific condition than the condition that the triplet energy of the dopant is less than or equal to the triplet energy of the host and the emitting compound. However, if the dopant concentration is too high, transfer of singlets to the emitting compound may be compromised. Also, too high a dopant concentration can result in faster device degradation.

For embodiments where the laser is pumped electrically, i.e., where the emissive layer is between an anode and a cathode, t is also preferable to select concentrations of the emitting compound, the host and the dopant that result in the highest emitting layer mobility.

In some embodiments, the triplet energy of the dopant compound is preferably greater than 1.3 eV, and more preferably greater than 1.6 eV. 130 kJ/mol is around 1.3 eV If the triplet energy of the host material is sufficiently high, the triplet sink dopant triplet energy may also be high. For example, anthracene (1.6 eV triplet exciton) as a triplet sink in $Alq_3$ is an example. The use of high energy materials as described herein enables hosts that are capable of supporting high energy fluorescent emitters, such as blue-emitting emitters. Because technology for organic emitting compounds is generally weaker for blue emitters, the use of high energy hosts and triplet sinks to improve the performance of blue-emitting fluorescent laser devices is a particularly desirable result. In a particularly preferred embodiment, the triplet energy of the dopant compound is at least 1.3 eV, preferably at least 1.6 eV, and not more than 1.7 eV for the reasons described herein.

The first device may be a consumer product. In the context of this application, such a consumer product include any product available for purchase that includes a laser. Examples include printers, communications equipment, CD/DVD devices, and many other well known products. One of skill in the art can readily substitute the lasers described herein for the conventional lasers already used in such consumer products.

In some embodiments, in the first device as described above, the organic semiconductor laser may further comprise a feedback structure. The feedback structure may be configured to reflect (or otherwise divert or direct) photons having a specific wavelength and phase to travel back through the gain (i.e. lasing) medium. The feedback structure may comprise, on one or both ends, a partially transmissive surface that allows a fraction of the photons to transmit through the interface (whereas the remaining photons may be reflected or otherwise directed back through the gain medium. In some embodiments, the feedback structure may comprise one or more mirrors (e.g. a half silvered mirror) and or diffractive grating. In some embodiments, the feedback structure may comprise anyone of, or some combination of a planar waveguide structure; a distributed feedback structure; a Bragg reflector feedback structure; or a vertical cavity structure surface emitting structure (VCSEL). However, any suitable feedback structure may be used in embodiments disclosed herein as would be understood by one of ordinary skill in the art. For example, in some embodiments, in the first device as described above, the organic semiconductor laser may further comprise a substrate. The anode of the device may be disposed over the substrate and at least one mirror is disposed between the substrate and the anode.

A method is provided. An organic semiconductor laser is provided. The organic semiconductor laser further includes an optical cavity and an organic layer disposed within the optical cavity. The organic layer includes: an organic host compound; an organic emitting compound capable of fluorescent emission; and an organic dopant compound. The organic dopant compound may also be referred to herein as a "triplet manager." The triplet energy of the organic dopant compound is lower than or equal to the triplet energy of the organic host compound. The triplet energy of the organic dopant compound is lower or equal to than the triplet energy of the organic emitting compound. The singlet energy of the organic emitting compound is lower than or equal to the singlet energy of the organic host compound. The organic semiconductor laser is pumped to achieve lasing.

In some embodiments, in the method as described above, the singlet energy of the organic emitting compound is lower than the singlet energy of the organic host compound.

In one embodiment, the pumping is optical pumping.

In one embodiment, the pumping is electrical pumping.

When the organic semiconductor laser is pumped, lasing is achieved for at least 1 microsecond.

In some embodiments, the organic semiconductor laser is pumped at a power that exceeds the pulse threshold.

In some embodiments, the organic semiconductor laser is pumped at a power that exceeds the continuous wave threshold.

In some embodiment, the organic semiconductor laser is pumped at a power that exceeds the continuous wave threshold for at least 1 microsecond, and more preferably for at least 100 microseconds.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works, and modeling of specific configurations, are not intended to be limiting.

The invention claimed is:

1. A first device, further comprising:
   an organic semiconductor laser, further comprising:
      an optical cavity;
         an organic layer disposed within the optical cavity, the organic layer comprising:
         an organic host compound;
         an organic emitting compound capable of fluorescent emission; and an organic dopant compound;
      wherein:
         the triplet energy of the organic dopant compound is lower than or equal to the triplet energy of the organic host compound;
         the triplet energy of the organic dopant compound is lower or equal to than the triplet energy of the organic emitting compound;
         the singlet energy of the organic emitting compound is lower than or equal to the singlet energy of the organic host compound.

2. The first device of claim 1, wherein the singlet energy of the organic emitting compound is lower than the singlet energy of the organic host compound.

3. The first device of claim 1, wherein the singlet energy of the organic emitting compound is lower than the singlet energy of the organic dopant compound.

4. The first device of claim 1, wherein the organic dopant compound does not strongly absorb the fluorescent emission of the organic emitting compound.

5. The first device of claim 1, further comprising an optical pump optically coupled to the organic layer.

6. The first device of claim 1, wherein the organic semiconductor laser further comprises:
an anode;
a cathode;
wherein the organic layer is disposed between the anode and the cathode;
a hole transport layer disposed between the organic layer and the anode; and
an electron transport layer disposed between the organic layer and the cathode;
wherein the organic dopant compound is present only in the emissive layer.

7. The first device of claim 1, wherein the triplet decay time of the dopant compound is shorter than the triplet decay time of the emitting compound.

8. The first device of claim 1, wherein:
the concentration of the dopant compound is 10 wt %-90 wt %;
the concentration of the emitting compound is 0.5 wt %-5 wt %.

9. The first device of claim 1, wherein the organic emitting compound is capable of fluorescent emission at room temperature.

10. The first device of claim 1, wherein the dopant compound is selected from the group consisting of: anthracene, tetracene, rubrene, and perylene and their derivatives.

11. The first device of claim 1, wherein the dopant compound is selected from anthracene and its derivatives.

12. The first device of claim 11, wherein the dopant compound is ADN.

13. The first device of claim 1, wherein the dopant compound is a phosphor.

14. The first device of claim 1, wherein the dopant compound is a fluorophore.

15. The first device of claim 1, wherein the first device is a consumer product.

16. A method, comprising:
providing an organic semiconductor laser, further comprising:
an optical cavity;
an organic layer disposed within the optical cavity, the organic layer comprising:
an organic host compound;
an organic emitting compound capable of fluorescent emission; and
an organic dopant compound;
wherein:
the triplet energy of the organic dopant compound is lower than or equal to the triplet energy of the organic host compound;
the triplet energy of the organic dopant compound is lower or equal to than the triplet energy of the organic emitting compound;
the singlet energy of the organic emitting compound is lower than or equal to the singlet energy of the organic host compound;
pumping the organic semiconductor laser to achieve lasing.

17. The method of claim 16, wherein the singlet energy of the organic emitting compound is lower than the singlet energy of the organic host compound.

18. The method of claim 16, wherein the pumping is optical pumping.

19. The method of claim 16, wherein the pumping is electrical pumping.

20. The method of claim 16, wherein lasing is achieved for at least 1 microsecond.

21. The method of claim 16, wherein the organic semiconductor laser is pumped at a power that exceeds the pulse threshold.

22. The method of claim 16, wherein the organic semiconductor laser is pumped at a power that exceeds the continuous wave threshold.

23. The method of claim 16, wherein the organic semiconductor laser is pumped at a power that exceeds the continuous wave threshold for at least 1 microsecond.

24. The method of claim 16, wherein the organic semiconductor laser is pumped at a power that exceeds the continuous wave threshold for at least 100 microseconds.

25. A first device, further comprising:
an organic semiconductor laser, further comprising:
an optical cavity;
an organic layer disposed within the optical cavity, the organic layer comprising:
an organic host compound;
an organic emitting compound capable of fluorescent emission; and
an organic dopant compound;
wherein:
the triplet energy of the organic dopant compound is lower than or equal to the triplet energy of the organic host compound;
the triplet energy of the organic dopant compound is lower or equal to than the triplet energy of the organic emitting compound;
the singlet energy of the organic emitting compound is lower than or equal to the singlet energy of the organic host compound;
wherein the organic semiconductor laser further comprises:
an anode;
a cathode; wherein the organic layer is disposed between the anode and the cathode;
a hole transport layer disposed between the organic layer and the anode; and
an electron transport layer disposed between the organic layer and the cathode;
wherein the organic dopant compound is present only in the emissive layer;
wherein the organic semiconductor laser further comprises:
a hole injection layer disposed between the anode and the hole transport layer; and
an electron injection layer disposed between the cathode and the electron transport layer.

26. A first device, further comprising:
an organic semiconductor laser, further comprising:
an optical cavity;
an organic layer disposed within the optical cavity, the organic layer comprising:
an organic host compound;
an organic emitting compound capable of fluorescent emission; and
an organic dopant compound;
wherein:
the triplet energy of the organic dopant compound is lower than or equal to the triplet energy of the organic host compound;
the triplet energy of the organic dopant compound is lower or equal to than the triplet energy of the organic emitting compound;

the singlet energy of the organic emitting compound is lower than or equal to the singlet energy of the organic host compound;

wherein the organic semiconductor laser further comprises:

an anode;

a cathode; wherein the organic layer is disposed between the anode and the cathode;

a hole transport layer disposed between the organic layer and the anode; and an electron transport layer disposed between the organic layer and the cathode;

wherein the organic dopant compound is present only in the emissive layer;

wherein the organic semiconductor laser further comprises a feedback structure.

27. The first device of claim 26, wherein the feedback structure comprises any one of, or some combination of:

a planar waveguide structure;

a distributed feedback structure;

a Bragg reflector feedback structure; or a vertical cavity structure surface emitting structure (VCSEL).

28. A first device, further comprising:

an organic semiconductor laser, further comprising:

an optical cavity;

an organic layer disposed within the optical cavity, the organic layer comprising:

an organic host compound;

an organic emitting compound capable of fluorescent emission; and an organic dopant compound;

wherein:

the triplet energy of the organic dopant compound is lower than or equal to the triplet energy of the organic host compound;

the triplet energy of the organic dopant compound is lower or equal to than the triplet energy of the organic emitting compound;

the singlet energy of the organic emitting compound is lower than or equal to the singlet energy of the organic host compound;

wherein the organic semiconductor laser further comprises:

an anode;

a cathode; wherein the organic layer is disposed between the anode and the cathode;

a hole transport layer disposed between the organic layer and the anode; and an electron transport layer disposed between the organic layer and the cathode;

wherein the organic dopant compound is present only in the emissive layer;

wherein the organic semiconductor laser further comprises a substrate, wherein:

the anode is disposed over the substrate; and at least one mirror is disposed between the substrate and the anode.

\* \* \* \* \*